US009697672B2

(12) United States Patent
Thomas et al.

(10) Patent No.: US 9,697,672 B2

(45) Date of Patent: Jul. 4, 2017

(54) WAGERING GAME WITH SPECIAL-EVENT ELIGIBILITY FEATURE BASED ON PASSIVE GAME PLAY

(75) Inventors: Alfred Thomas, Las Vegas, NV (US); Mark B. Gagner, West Chicago, IL (US)

(73) Assignee: Bally Gaming, Inc., Las Vegas, NV (US)

( * ) Notice: Subject to any disclaimer, the term of this patent is extended or adjusted under 35 U.S.C. 154(b) by 2384 days.

(21) Appl. No.: 12/374,218

(22) PCT Filed: Jul. 19, 2007

(86) PCT No.: PCT/US2007/016346

§ 371 (c)(1), (2), (4) Date: Jan. 16, 2009

(87) PCT Pub. No.: WO2008/011089

PCT Pub. Date: Jan. 24, 2008

(65) Prior Publication Data

US 2010/0016056 A1 Jan. 21, 2010

Related U.S. Application Data

(60) Provisional application No. 60/832,105, filed on Jul. 20, 2006.

(51) Int. Cl.

*A63F 13/00* (2014.01)
*H01L 21/30* (2006.01)
*G07F 17/32* (2006.01)

(52) U.S. Cl.

CPC .................................... *G07F 17/32* (2013.01)

(58) Field of Classification Search

CPC ............................. G07F 17/32; G07F 17/3239

(Continued)

(56) References Cited

U.S. PATENT DOCUMENTS 4,572,509 A 2/1986 Sitrick ............................ 273/85
5,393,057 A 2/1995 Marnell, II ..................... 273/85

(Continued)

FOREIGN PATENT DOCUMENTS

WO WO 98/51384 11/1998 ............... A63F 9/22
WO WO 01/99067 A2 12/2001 ............ G07F 17/32

(Continued)

OTHER PUBLICATIONS

Written Opinion corresponding to co-pending International Patent Application Serial No. PCT/US2007/16346, United States Patent Office, dated Sep. 15, 2008, 3 pages.

(Continued)

*Primary Examiner* — Mary Wilczewski
*Assistant Examiner* — Tsz Chiu
(74) *Attorney, Agent, or Firm* — Nixon Peabody LLP

(57) ABSTRACT

According to one aspect of the invention, a gaming system and method for providing passive participation in at least one wagering game are disclosed. Funds are received to obtain a period of eligibility for an award associated with the wagering game. An entertainment layer having a plurality of features is conducted in response to receiving the wager. A separate gaming layer includes the wagering game. A gaming machine having a display and a player input device is in communication with the entertainment layer and the gaming layer. At least one feature of the entertainment layer is conducted during the period of eligibility. The entertainment layer is operable in response to at least one input from the player input device. Information regarding the wagering game is presented on the gaming machine.

15 Claims, 15 Drawing Sheets

(58) Field of Classification Search

USPC .............. 463/16; 257/16, E23.067, E23.069, 257/E23.078, 710, 248, 704, 784; 29/593, 832, 840; 228/180.22; 361/768, 361/774, 776

See application file for complete search history.

(56) References Cited

U.S. PATENT DOCUMENTS

| | | | | |
|---|---|---|---|---|
| 5,580,309 | A | 12/1996 | Piechowiak et al. | 463/16 |
| 5,711,715 | A | 1/1998 | Ringo et al. | 473/9 |
| 5,755,621 | A | 5/1998 | Marks et al. | 463/42 |
| 5,779,549 | A | 7/1998 | Walker et al. | 463/42 |
| 5,830,063 | A | 11/1998 | Byrne | 463/18 |
| 6,039,648 | A | 3/2000 | Guinn et al. | 463/16 |
| 6,077,162 | A | 6/2000 | Weiss | 463/26 |
| 6,089,980 | A | 7/2000 | Gauselmann | 463/27 |
| 6,142,872 | A | 11/2000 | Walker et al. | 463/16 |
| 6,287,202 | B1 | 9/2001 | Pascal et al. | 463/42 |
| 6,293,865 | B1 | 9/2001 | Kelly et al. | 463/16 |
| 6,309,299 | B1 | 10/2001 | Weiss | 463/20 |
| 6,364,314 | B1 | 4/2002 | Canterbury | 273/274 |
| 6,416,408 | B2 | 7/2002 | Tracy et al. | 463/16 |
| 6,800,026 | B2 | 10/2004 | Cannon | 463/16 |
| 6,837,793 | B2 | 1/2005 | McClintic | 463/42 |
| 6,869,361 | B2 | 3/2005 | Sharpless et al. | 463/25 |
| 6,884,167 | B2 | 4/2005 | Walker et al. | 463/20 |
| 6,887,154 | B1 | 5/2005 | Luciano, Jr. et al. | 463/26 |
| 6,908,390 | B2 | 6/2005 | Nguyen et al. | 463/42 |
| 6,916,244 | B2 | 7/2005 | Gatto et al. | 463/25 |
| 6,916,245 | B1 | 7/2005 | Vancura et al. | 463/26 |
| 6,921,331 | B2 | 7/2005 | Gatto et al. | 463/6 |
| 7,077,744 | B2 | 7/2006 | Cannon | 463/20 |
| 7,097,562 | B2 | 8/2006 | Gagner | 463/42 |
| 7,169,041 | B2 | 1/2007 | Tessmer et al. | 463/16 |
| 7,234,117 | B2 | 6/2007 | Zaner et al. | 715/758 |
| 7,270,605 | B2 | 9/2007 | Russell et al. | 463/40 |
| 2002/0039923 | A1 | 4/2002 | Cannon et al. | 463/42 |
| 2002/0065097 | A1 | 5/2002 | Brockenbrough et al. | 455/552 |
| 2002/0077170 | A1 | 6/2002 | Johnson et al. | 463/16 |
| 2002/0116615 | A1* | 8/2002 | Nguyen | H04L 67/38 713/168 |
| 2002/0119824 | A1 | 8/2002 | Allen | 463/42 |
| 2003/0036430 | A1 | 2/2003 | Cannon | 463/42 |
| 2003/0060264 | A1 | 3/2003 | Chilton et al. | 463/20 |
| 2003/0070178 | A1 | 4/2003 | Boyd et al. | 725/110 |
| 2003/0114217 | A1 | 6/2003 | Walker et al. | |
| 2003/0119576 | A1 | 6/2003 | McClintic et al. | 463/20 |
| 2003/0125107 | A1 | 7/2003 | Cannon | 463/25 |
| 2003/0186733 | A1 | 10/2003 | Wolf et al. | 463/16 |
| 2003/0190960 | A1 | 10/2003 | Jokipii et al. | 463/42 |
| 2004/0087368 | A1 | 5/2004 | Gauselmann | 463/42 |
| 2004/0121842 | A1 | 6/2004 | Willis et al. | 463/42 |
| 2004/0127284 | A1 | 7/2004 | Walker et al. | |
| 2004/0139468 | A1 | 7/2004 | Kidd | 725/86 |
| 2004/0204226 | A1 | 10/2004 | Foster et al. | 463/20 |
| 2004/0248637 | A1 | 12/2004 | Liebenberg et al. | 463/16 |
| 2004/0260761 | A1 | 12/2004 | Leaute et al. | 709/201 |
| 2005/0003881 | A1 | 1/2005 | Byng | 463/16 |
| 2005/0003886 | A1 | 1/2005 | Englman et al. | 463/25 |
| 2005/0020340 | A1 | 1/2005 | Cannon | 463/16 |
| 2005/0043088 | A1 | 2/2005 | Nguyen et al. | 463/29 |
| 2005/0043089 | A1 | 2/2005 | Nguyen et al. | 463/29 |
| 2005/0043094 | A1 | 2/2005 | Nguyen et al. | 463/42 |
| 2005/0059494 | A1* | 3/2005 | Kammler | G07F 17/32 463/42 |
| 2005/0071024 | A1 | 3/2005 | Henshaw | 700/91 |
| 2005/0071481 | A1 | 3/2005 | Danieli | 709/229 |
| 2005/0076092 | A1 | 4/2005 | Chang et al. | 709/217 |
| 2005/0096133 | A1 | 5/2005 | Hoefelmeyer et al. | 463/40 |
| 2005/0102047 | A1 | 5/2005 | Ottofy | 700/91 |
| 2005/0113162 | A1 | 5/2005 | Olive et al. | 463/16 |
| 2005/0130728 | A1 | 6/2005 | Nguyen et al. | |
| 2005/0170876 | A1* | 8/2005 | Masci et al. | 463/16 |
| 2005/0198318 | A1* | 9/2005 | von Mueller | G06Q 20/3224 709/228 |
| 2005/0282628 | A1 | 12/2005 | Beatty et al. | 463/27 |
| 2005/0282637 | A1 | 12/2005 | Gatto et al. | 463/42 |
| 2006/0010204 | A1 | 1/2006 | Jalava et al. | 709/205 |
| 2006/0030959 | A1 | 2/2006 | Duhamel | 700/91 |
| 2006/0040742 | A1 | 2/2006 | Wright et al. | 463/42 |
| 2006/0073880 | A1 | 4/2006 | Thomas | 463/20 |
| 2006/0073897 | A1 | 4/2006 | Englman et al. | 463/42 |
| 2006/0082056 | A1 | 4/2006 | Kane et al. | 273/138.1 |
| 2006/0084502 | A1* | 4/2006 | Downs, III | G07F 17/32 463/29 |
| 2006/0094495 | A1 | 5/2006 | Gelber et al. | 463/20 |
| 2006/0121971 | A1 | 6/2006 | Slomiany et al. | 463/16 |
| 2006/0148565 | A1 | 7/2006 | Gauselmann et al. | 463/41 |
| 2006/0160625 | A1 | 7/2006 | Englman et al. | 463/42 |
| 2006/0178202 | A1 | 8/2006 | Hughes et al. | 463/20 |
| 2006/0183550 | A1 | 8/2006 | Gagner et al. | 463/42 |
| 2006/0194589 | A1 | 8/2006 | Sankisa | 455/456.1 |
| 2006/0234791 | A1 | 10/2006 | Nguyen et al. | 463/16 |
| 2006/0241795 | A1 | 10/2006 | Weingardt et al. | 700/91 |
| 2006/0252546 | A1 | 11/2006 | Castellari et al. | 463/42 |
| 2006/0287043 | A1 | 12/2006 | Englman et al. | 463/16 |
| 2006/0287106 | A1 | 12/2006 | Jensen | 463/42 |
| 2007/0054739 | A1 | 3/2007 | Amaitis et al. | 463/42 |
| 2007/0060317 | A1 | 3/2007 | Martin | 463/26 |
| 2007/0078962 | A1 | 4/2007 | Donnelli et al. | 709/223 |
| 2007/0087832 | A1 | 4/2007 | Abbott et al. | 463/42 |
| 2007/0111797 | A1 | 5/2007 | Sasaki et al. | 463/42 |
| 2007/0129147 | A1 | 6/2007 | Gagner | 463/42 |
| 2007/0136817 | A1 | 6/2007 | Nguyen | 726/26 |
| 2007/0149279 | A1 | 6/2007 | Norden et al. | 463/29 |
| 2007/0173324 | A1 | 7/2007 | Multerer et al. | 463/42 |
| 2007/0191100 | A1 | 8/2007 | Counts | 463/42 |
| 2007/0191105 | A1 | 8/2007 | Azuma | 463/42 |
| 2007/0218996 | A1 | 9/2007 | Harris et al. | 463/42 |
| 2009/0156304 | A1* | 6/2009 | Ryan | G07F 17/3239 463/29 |

FOREIGN PATENT DOCUMENTS

| | | | | |
|---|---|---|---|---|
| WO | WO 03/067175 | A1 | 8/2003 | F41J 5/02 |
| WO | WO 03/083796 | A1 | 10/2003 | G07F 17/32 |
| WO | WO 2005/077480 | A1 | 8/2005 | A63F 13/00 |
| WO | WO 2005/102480 | A1 | 11/2005 | A63F 13/00 |
| WO | WO 2005/113088 | A1 | 12/2005 | A63F 13/00 |
| WO | WO 2006/015442 | A1 | 2/2006 | A63F 12/12 |
| WO | WO 2006/028740 | A2 | 3/2006 | A63F 9/24 |
| WO | WO 2006/039137 | A1 | 4/2006 | A63F 9/24 |
| WO | WO 2006/121663 | A2 | 11/2006 | A63F 9/24 |
| WO | WO 2007/006002 | A2 | 1/2007 | G06F 19/00 |
| WO | WO 2007/030552 | A2 | 3/2007 | A63B 71/00 |
| WO | WO 2007/030632 | A2 | 3/2007 | A63F 13/00 |
| WO | WO 2007/030675 | A2 | 3/2007 | A63F 13/00 |
| WO | WO 2007/030733 | A2 | 3/2007 | A63F 13/00 |
| WO | WO 2007/030801 | A2 | 3/2007 | A63F 9/24 |
| WO | WO 2007/087297 | A2 | 8/2007 | A63F 9/24 |
| WO | WO 2007/103054 | A2 | 9/2007 | G06F 19/00 |
| WO | WO 2007/127259 | A2 | 11/2007 | G06F 19/00 |

OTHER PUBLICATIONS

International Search Report corresponding to co-pending International Patent Application Serial No. PCT/US2007/16346, United States Patent Office, dated Sep. 15, 2008, 2 pages.

* cited by examiner

WAGERING GAME WITH SPECIAL-EVENT ELIGIBILITY FEATURE BASED ON PASSIVE GAME PLAY

CROSS REFERENCE TO RELATED APPLICATIONS

This application is a U.S. national stage of International Application No. PCT/US2007/016346, filed Jul. 19, 2007, which is related to and claims priority to U.S. Provisional Application No. 60/832,105, filed Jul. 20, 2006, each of which is incorporated herein in its entirety.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates generally to gaming machines, and methods for playing wagering games, and more particularly, to a gaming system having a wagering-game eligibility feature based on passive or casual game play.

BACKGROUND OF THE INVENTION

Gaming machines, such as slot machines, video poker machines and the like, have been a cornerstone of the gaming industry for several years. Generally, the popularity of such machines with players is dependent on the likelihood (or perceived likelihood) of winning money at the machine and the intrinsic entertainment value of the machine relative to other available gaming options. Where the available gaming options include a number of competing machines and the expectation of winning at each machine is roughly the same (or believed to be the same), players are likely to be attracted to the most entertaining and exciting machines. Shrewd operators consequently strive to employ the most entertaining and exciting machines, features, and enhancements available because such machines attract frequent play and hence increase profitability to the operator. Therefore, there is a continuing need for gaming machine manufacturers to continuously develop new games and improved gaming enhancements that will attract frequent play through enhanced entertainment value to the player.

One concept that has been successfully employed to enhance the entertainment value of a game is the concept of a “secondary” or “bonus” game that may be played in conjunction with a “basic” game. The bonus game may comprise any type of game, either similar to or completely different from the basic game, which is entered upon the occurrence of a selected event or outcome in the basic game. Generally, bonus games provide a greater expectation of winning than the basic game and may also be accompanied with more attractive or unusual video displays and/or audio. Bonus games may additionally award players with “progressive jackpot” awards that are funded, at least in part, by a percentage of coin-in from the gaming machine or a plurality of participating gaming machines.

Another concept that has been successfully employed to enhance the entertainment value of a game is the concept of a “community” game. The community game may comprise any type of game, either similar to or completely different from the basic and/or bonus games, which is entered upon the occurrence of a selected event or outcome in the basic and/or bonus games. Generally, community games generate excitement amongst a group of players participating at a bank of gaming machines.

Because the bonus and community game concepts offer tremendous advantages in player appeal and excitement relative to other known games, and because such games are attractive to both players and operators, there is a continuing need to develop gaming machines with new methods of obtaining participation in these features of the wagering games.

SUMMARY OF THE INVENTION

According to one aspect of the invention, a method of providing passive participation in a wagering game is disclosed. The method includes receiving funds to obtain a period of eligibility for an award associated with the wagering game and conducting at least one feature of an entertainment layer on a gaming machine during the period of eligibility. The method further includes presenting information regarding an outcome the wagering game on the gaming machine.

According to another aspect of the invention, a method of providing passive participation in a wagering game is disclosed. The method includes receiving funds to obtain a period of eligibility for an award associated with the wagering game and conducting an entertainment layer having a plurality of features. The method further includes conducting a gaming layer including the at least one wagering game and providing a gaming machine including a display and a player input device. The gaming machine is in communication with the entertainment layer and the gaming layer. The display is adapted to present information provided to the gaming machine from the entertainment layer and the gaming layer. The method further includes conducting at least one feature of the entertainment layer during the period of eligibility. The entertainment layer is operable in response to at least one input from the player input device. The method further includes presenting information regarding the wagering game on the gaming machine.

According to yet another aspect of the invention, a method of conducting a wagering game is disclosed. The method includes providing a handheld gaming machine configured to monitor the wagering game. The handheld gaming machine is in communication with a gaming layer and an entertainment layer. The gaming layer includes the wagering game. The method further includes receiving a wager from a player to obtain the handheld gaming machine for a time. The received wager funds the player’s period of eligibility for the wagering game.

According to one aspect of the present invention, a gaming system for conducting a wagering game includes a gaming network including at least one game controller and at least one access point. The gaming system further includes a value input device for receiving a wager for the wagering game. The gaming system further includes a handheld gaming machine including a controller, at least one display, at least one player input device to permit input of a command to the handheld gaming machine, and a communication device to permit communication between the handheld gaming machine and the gaming network via the at least one access point. The controller of the handheld gaming machine is operative to (i) present a gaming layer including the wagering game, and (ii) present an entertainment layer during a period of eligibility for the wagering game in response to a wager being received at the value input device.

According to yet another aspect of the invention, a computer readable storage medium is encoded with instructions for directing a gaming system to perform the above methods.

Additional aspects of the invention will be apparent to those of ordinary skill in the art in view of the detailed description of various embodiments, which is made with reference to the drawings, a brief description of which is provided below.

DETAILED DESCRIPTION

Figure 1A:
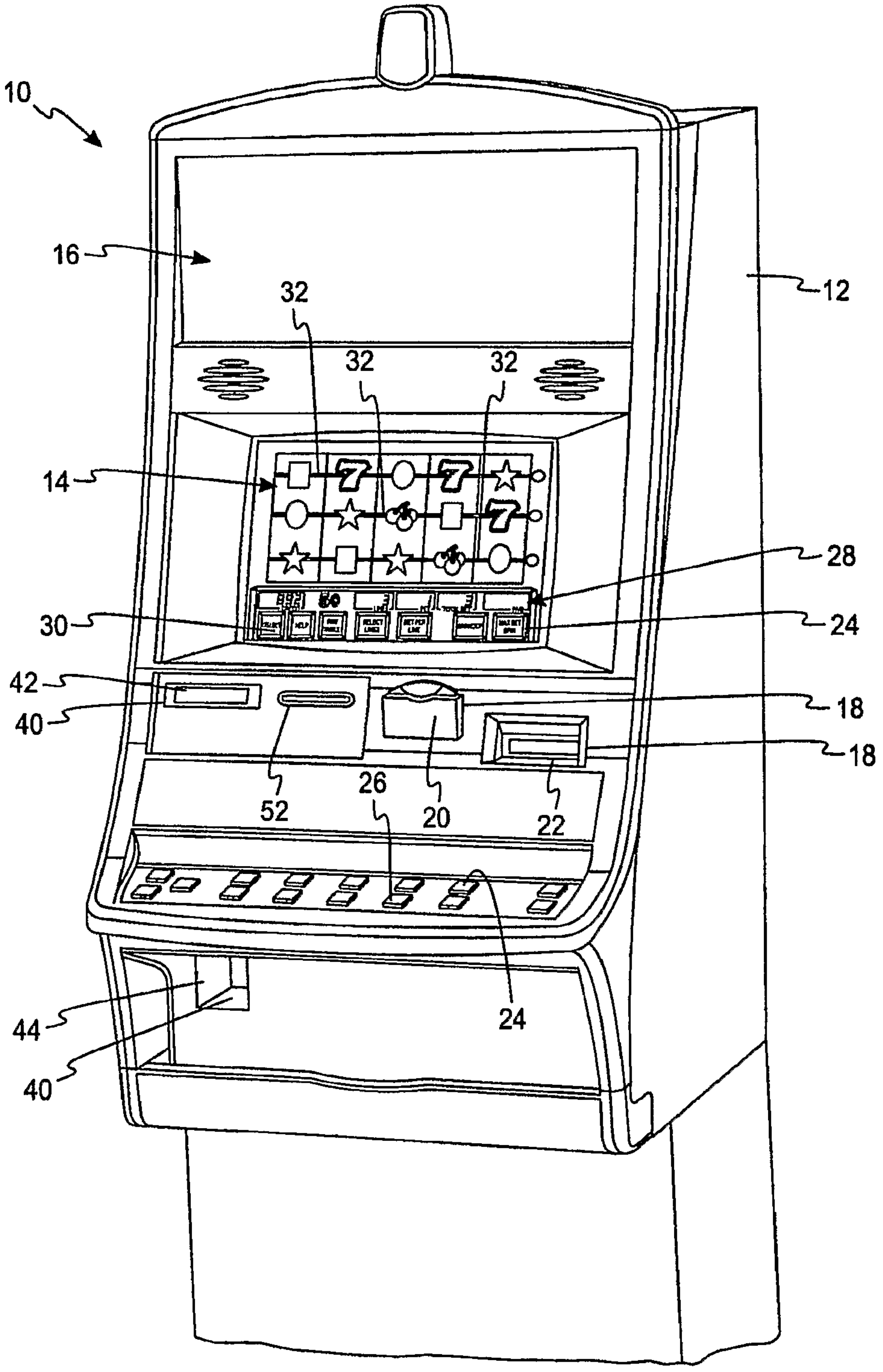
FIG. 1*a* is a perspective view of a free standing gaming machine embodying the present invention.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Referring to FIG. 1*a*, a gaming machine 10 is used in gaming establishments such as casinos. With regard to the present invention, the gaming machine 10 may be any type of gaming machine and may have varying structures and methods of operation. For example, the gaming machine 10 may be an electromechanical gaming machine configured to play mechanical slots, or it may be an electronic gaming machine configured to play a video casino game, such as blackjack, slots, keno, poker, blackjack, roulette, etc.

The gaming machine 10 comprises a housing 12 and includes input devices, including a value input device 18 and a player input device 24. For output the gaming machine 10 includes a primary display 14 for displaying information about the basic wagering game. The primary display 14 can also display information about a bonus wagering game and a progressive wagering game. The gaming machine 10 may also include a secondary display 16 for displaying game events, game outcomes, and/or signage information. While these typical components found in the gaming machine 10 are described below, it should be understood that numerous other elements may exist and may be used in any number of combinations to create various forms of a gaming machine 10.

The value input device 18 may be provided in many forms, individually or in combination, and is preferably located on the front of the housing 12. The value input device 18 receives currency and/or credits that are inserted by a player. The value input device 18 may include a coin acceptor 20 for receiving coin currency (see FIG. 1*a*). Alternatively, or in addition, the value input device 18 may include a bill acceptor 22 for receiving paper currency. Furthermore, the value input device 18 may include a ticket reader, or barcode scanner, for reading information stored on a credit ticket, a card, or other tangible portable credit storage device. The credit ticket or card may also authorize access to a central account, which can transfer money to the gaming machine 10.

The player input device 24 comprises a plurality of push buttons 26 on a button panel for operating the gaming machine 10. In addition, or alternatively, the player input device 24 may comprise a touch screen 28 mounted by adhesive, tape, or the like over the primary display 14 and/or secondary display 16. The touch screen 28 contains soft touch keys 30 denoted by graphics on the underlying primary display 14 and used to operate the gaming machine 10. The touch screen 28 provides players with an alternative method of input. A player enables a desired function either by touching the touch screen 28 at an appropriate touch key 30 or by pressing an appropriate push button 26 on the button panel. The touch keys 30 may be used to implement the same functions as push buttons 26. Alternatively, the push buttons 26 may provide inputs for one aspect of the operating the game, while the touch keys 30 may allow for input needed for another aspect of the game.

The various components of the gaming machine 10 may be connected directly to, or contained within, the housing 12, as seen in FIG. 1*a*, or may be located outboard of the housing 12 and connected to the housing 12 via a variety of different wired or wireless connection methods. Thus, the gaming machine 10 comprises these components whether housed in the housing 12, or outboard of the housing 12 and connected remotely.

The operation of the basic wagering game is displayed to the player on the primary display 14. The primary display 14 can also display the bonus game associated with the basic wagering game. The primary display 14 may take the form of a cathode ray tube (CRT), a high resolution LCD, a plasma display, an LED, or any other type of display suitable for use in the gaming machine 10. As shown, the primary display 14 includes the touch screen 28 overlaying the entire display (or a portion thereof) to allow players to make game-related selections. Alternatively, the primary display 14 of the gaming machine 10 may include a number of mechanical reels to display the outcome in visual association with at least one payline 32. In the illustrated embodiment, the gaming machine 10 is an “upright” version in which the primary display 14 is oriented vertically relative to the player. Alternatively, the gaming machine may be a “slant-top” version in which the primary display 14 is slanted at about a thirty-degree angle toward the player of the gaming machine 10.

A player begins play of the basic wagering game by making a wager via the value input device 18 of the gaming machine 10. A player can select play by using the player input device 24, via the buttons 26 or the touch screen keys 30. The basic game consists of a plurality of symbols arranged in an array, and includes at least one payline 32 that indicates one or more outcomes of the basic game. Such outcomes are randomly selected in response to the wagering input by the player. At least one of the plurality of randomly-selected outcomes may be a start-bonus outcome, which can include any variations of symbols or symbol combinations triggering a bonus game.

In some embodiments, the gaming machine 10 may also include a player information reader 52 that allows for identification of a player by reading a card with information indicating his or her true identity. The player information reader 52 is shown in FIG. 1*a* as a card reader, but may take on many forms including a ticket reader, bar code scanner, RFID transceiver or computer readable storage medium interface. Currently, identification is generally used by casinos for rewarding certain players with complimentary services or special offers. For example, a player may be enrolled in the gaming establishment’s loyalty club and may be awarded certain complimentary services as that player collects points in his or her player-tracking account. The player inserts his or her card into the player information reader 52, which allows the casino’s computers to register that player’s wagering at the gaming machine 10. The gaming machine 10 may use the secondary display 16 or other dedicated player-tracking display for providing the player with information about his or her account or other player-specific information. Also, in some embodiments, the information reader 52 may be used to restore game assets that the player achieved and saved during a previous game session.

Figure 1B:
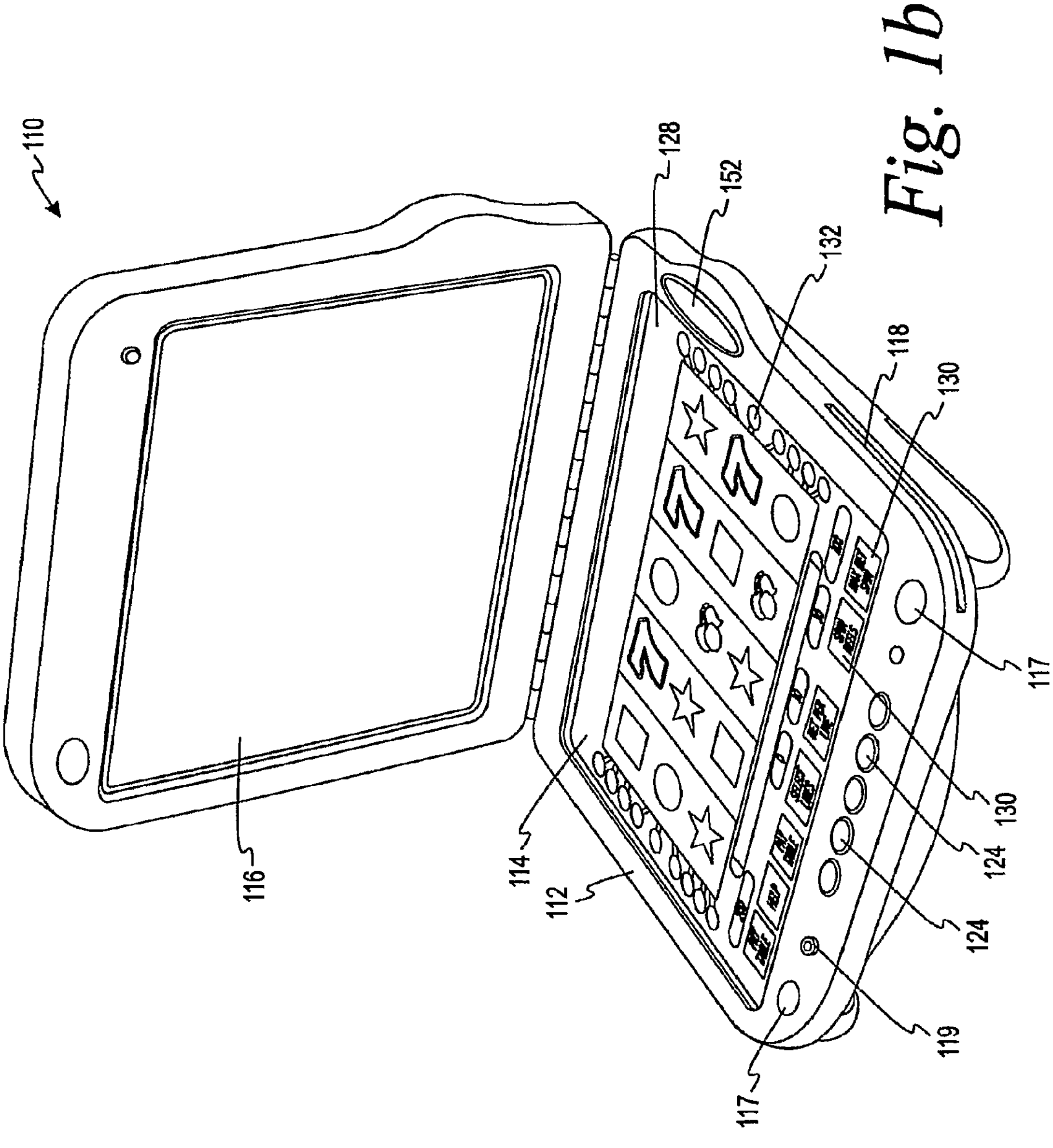
FIG. 1*b* is a perspective view of a handheld gaming machine embodying the present invention.

Depicted in FIG. 1*b* is a handheld or mobile gaming machine 110. Like the free standing gaming machine 10, the handheld gaming machine 110 is preferably an electronic gaming machine configured to play a video casino game such as, but not limited to, blackjack, slots, keno, poker, blackjack, and roulette. The handheld gaming machine 110 comprises a housing or casing 112 and includes input devices, including a value input device 118 and a player input device 124. For output the handheld gaming machine 110 includes, but is not limited to, a primary display 114, a secondary display 116, one or more speakers 117, one or more player-accessible ports 119 (e.g., an audio output jack for headphones, a video headset jack, etc.), and other conventional I/O devices and ports, which may or may not be player-accessible. In the embodiment depicted in FIG. 1*b*, the handheld gaming machine 110 comprises a secondary display 116 that is rotatable relative to the primary display 114. The optional secondary display 116 may be fixed, movable, and/or detachable/attachable relative to the primary display 114. Either the primary display 114 and/or secondary display 116 may be configured to display any aspect of a non-wagering game, wagering game, secondary games, bonus games, progressive wagering games, group games, shared-experience games or events, game events, game outcomes, scrolling information, text messaging, emails, alerts or announcements, broadcast information, subscription information, and handheld gaming machine status.

The player-accessible value input device 118 may comprise, for example, a slot located on the front, side, or top of the casing 112 configured to receive credit from a stored-value card (e.g., casino card, smart card, debit card, credit card, etc.) inserted by a player. In another aspect, the player-accessible value input device 118 may comprise a sensor (e.g., an RF sensor) configured to sense a signal (e.g., an RF signal) output by a transmitter (e.g., an RF transmitter) carried by a player. The player-accessible value input device 118 may also or alternatively include a ticket reader, or barcode scanner, for reading information stored on a credit ticket, a card, or other tangible portable credit or funds storage device. The credit ticket or card may also authorize access to a central account, which can transfer money to the handheld gaming machine 110.

Still other player-accessible value input devices 118 may require the use of touch keys 130 on the touch-screen display (e.g., primary display 114 and/or secondary display 116) or player input devices 124. Upon entry of player identification information and, preferably, secondary authorization information (e.g., a password, PIN number, stored value card number, predefined key sequences, etc.), the player may be permitted to access a player’s account. As one potential optional security feature, the handheld gaming machine 110 may be configured to permit a player to only access an account the player has specifically set up for the handheld gaming machine 110. Other conventional security features may also be utilized to, for example, prevent unauthorized access to a player’s account, to minimize an impact of any unauthorized access to a player’s account, or to prevent unauthorized access to any personal information or funds temporarily stored on the handheld gaming machine 110.

The player-accessible value input device 118 may itself comprise or utilize a biometric player information reader which permits the player to access available funds on a player’s account, either alone or in combination with another of the aforementioned player-accessible value input devices 118. In an embodiment wherein the player-accessible value input device 118 comprises a biometric player information reader, transactions such as an input of value to the handheld device, a transfer of value from one player account or source to an account associated with the handheld gaming machine 110, or the execution of another transaction, for example, could all be authorized by a biometric reading, which could comprise a plurality of biometric readings, from the biometric device.

Alternatively, to enhance security, a transaction may be optionally enabled only by a two-step process in which a secondary source confirms the identity indicated by a primary source. For example, a player-accessible value input device 118 comprising a biometric player information reader may require a confirmatory entry from another biometric player information reader 152, or from another source, such as a credit card, debit card, player ID card, fob key, PIN number, password, hotel room key, etc. Thus, a transaction may be enabled by, for example, a combination of the personal identification input (e.g., biometric input) with a secret PIN number, or a combination of a biometric input with a fob input, or a combination of a fob input with a PIN number, or a combination of a credit card input with a biometric input. Essentially, any two independent sources of identity, one of which is secure or personal to the player (e.g., biometric readings, PIN number, password, etc.) could be utilized to provide enhanced security prior to the electronic transfer of any funds. In another aspect, the value input device 118 may be provided remotely from the handheld gaming machine 110.

The player input device 124 comprises a plurality of push buttons on a button panel for operating the handheld gaming machine 110. In addition, or alternatively, the player input device 124 may comprise a touch screen 128 mounted to a primary display 114 and/or secondary display 116. In one aspect, the touch screen 128 is matched to a display screen having one or more selectable touch keys 130 selectable by a user's touching of the associated area of the screen using a finger or a tool, such as a stylus pointer. A player enables a desired function either by touching the touch screen 128 at an appropriate touch key 130 or by pressing an appropriate push button 126 on the button panel. The touch keys 130 may be used to implement the same functions as push buttons 126. Alternatively, the push buttons may provide inputs for one aspect of the operating the game, while the touch keys 130 may allow for input needed for another aspect of the game. The various components of the handheld gaming machine 110 may be connected directly to, or contained within, the casing 112, as seen in FIG. 1*b*, or may be located outboard of the casing 112 and connected to the casing 112 via a variety of hardwired (tethered) or wireless connection methods. Thus, the handheld gaming machine 110 may comprise a single unit or a plurality of interconnected parts (e.g., wireless connections) which may be arranged to suit a player's preferences.

The operation of the basic wagering game on the handheld gaming machine 110 is displayed to the player on the primary display 114. The primary display 114 can also display the bonus game associated with the basic wagering game. The primary display 114 preferably takes the form of a high resolution LCD, a plasma display, an LED, or any other type of display suitable for use in the handheld gaming machine 110. The size of the primary display 114 may vary from, for example, about a 2-3" display to a 15" or 17" display. In at least some aspects, the primary display 114 is a 7"-10" display. As the weight of and/or power requirements of such displays decreases with improvements in technology, it is envisaged that the size of the primary display may be increased. Optionally, coatings or removable films or sheets may be applied to the display to provide desired characteristics (e.g., anti-scratch, anti-glare, bacterially-resistant and anti-microbial films, etc.). In at least some embodiments, the primary display 114 and/or secondary display 116 may have a 16:9 aspect ratio or other aspect ratio (e.g., 4:3). The primary display 114 and/or secondary display 116 may also each have different resolutions, different color schemes, and different aspect ratios.

As with the free standing gaming machine 10, a player begins play of the basic wagering game on the handheld gaming machine 110 by making a wager (e.g., via the value input device 18 or an assignment of credits stored on the handheld gaming machine via the touch screen keys 130, player input device 124, or buttons 126) on the handheld gaming machine 110. In at least some aspects, the basic game may comprise a plurality of symbols arranged in an array, and includes at least one payline 132 that indicates one or more outcomes of the basic game. Such outcomes are randomly selected in response to the wagering input by the player. At least one of the plurality of randomly selected outcomes may be a start-bonus outcome, which can include any variations of symbols or symbol combinations triggering a bonus game.

In some embodiments, the player-accessible value input device 118 of the handheld gaming machine 110 may double as a player information reader 152 that allows for identification of a player by reading a card with information indicating the player's identity (e.g., reading a player's credit card, player ID card, smart card, etc.). The player information reader 152 may alternatively or also comprise a bar code scanner, RFID transceiver or computer readable storage medium interface. In one presently preferred aspect, the player information reader 152, shown by way of example in FIG. 1*b*, comprises a biometric sensing device.

Figure 2:
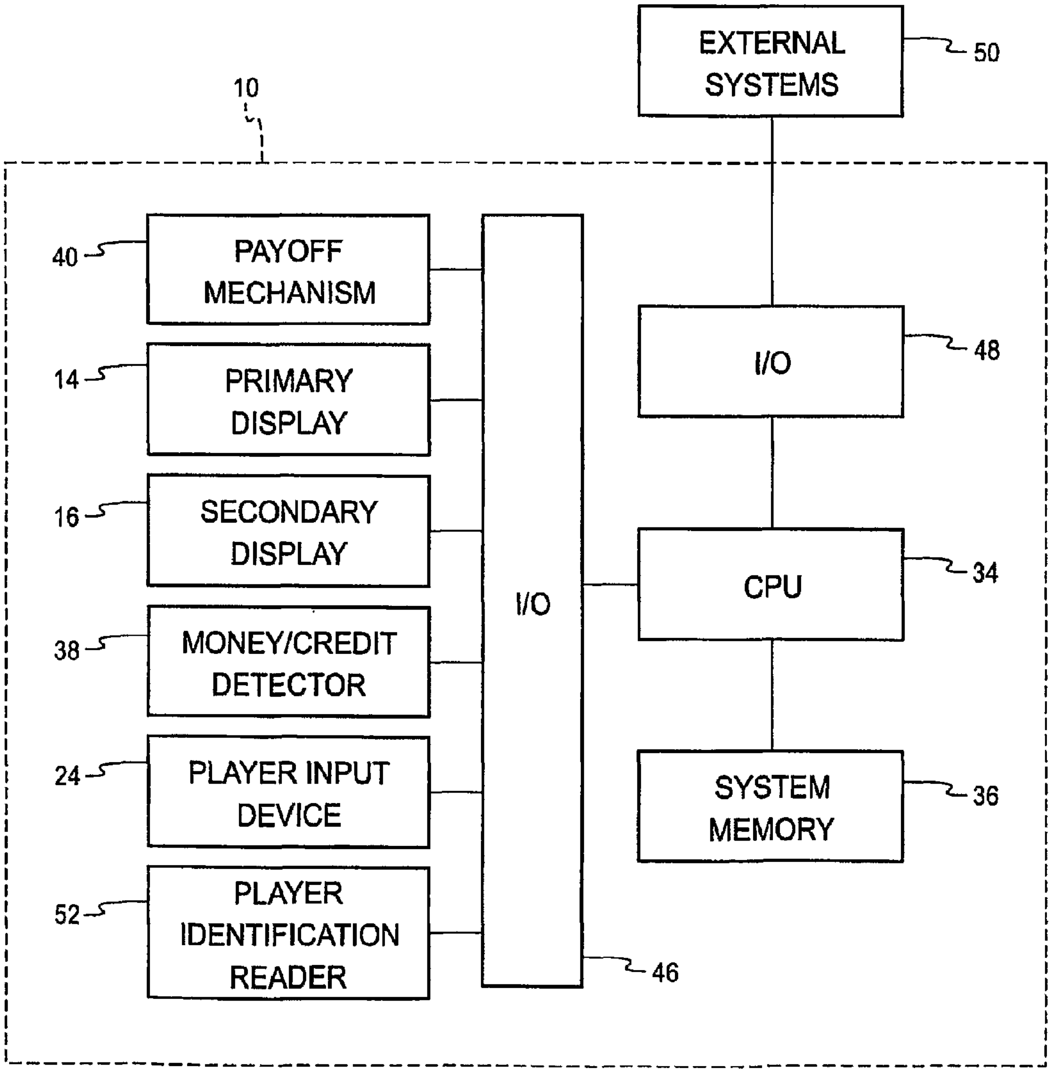
FIG. 2 is a block diagram of a control system suitable for operating the gaming machines of FIGS. 1*a* and 1*b;*

Turning now to FIG. 2, the various components of the gaming machine 10 are controlled by a central processing unit (CPU) 34, also referred to herein as a controller or processor (such as a microcontroller or microprocessor). To provide gaming functions, the controller 34 executes one or more game programs stored in a computer readable storage medium, in the form of memory 36. The controller 34 performs the random selection (using a random number generator (RNG)) of an outcome from the plurality of possible outcomes of the wagering game. Alternatively, the random event may be determined at a remote controller. The remote controller may use either an RNG or pooling scheme for its central determination of a game outcome. It should be appreciated that the controller 34 may include one or more microprocessors, including but not limited to a master processor, a slave processor, and a secondary or parallel processor.

The controller 34 is also coupled to the system memory 36 and a money/credit detector 38. The system memory 36 may comprise a volatile memory (e.g., a random-access memory (RAM)) and a non-volatile memory (e.g., an EEPROM). The system memory 36 may include multiple RAM and multiple program memories. The money/credit detector 38 signals the processor that money and/or credits have been input via the value input device 18. Preferably, these components are located within the housing 12 of the gaming machine 10. However, as explained above, these components may be located outboard of the housing 12 and connected to the remainder of the components of the gaming machine 10 via a variety of different wired or wireless connection methods.

As seen in FIG. 2, the controller 34 is also connected to, and controls, the primary display 14, the player input device 24, and a payoff mechanism 40. The payoff mechanism 40 is operable in response to instructions from the controller 34 to award a payoff to the player in response to certain winning outcomes that might occur in the basic game or the bonus game(s). The payoff may be provided in the form of points, bills, tickets, coupons, cards, etc. For example, in FIG. 1*a*, the payoff mechanism 40 includes both a ticket printer 42 and a coin outlet 44. However, any of a variety of payoff mechanisms 40 well known in the art may be implemented, including cards, coins, tickets, smartcards, cash, etc. The payoff amounts distributed by the payoff mechanism 40 are determined by one or more pay tables stored in the system memory 36.

Communications between the controller 34 and both the peripheral components of the gaming machine 10 and external systems 50 occur through input/output (I/O) circuits 46, 48. More specifically, the controller 34 controls and receives inputs from the peripheral components of the gaming machine 10 through the input/output circuits 46. Further, the controller 34 communicates with the external systems 50 via the I/O circuits 48 and a communication path (e.g., serial, parallel, IR, RC, 10 bT, etc.). The external systems 50 may include a gaming network, other gaming machines, a gaming server, communications hardware, or a variety of other interfaced systems or components. Although the I/O circuits

46, 48 may be shown as a single block, it should be appreciated that each of the I/O circuits 46, 48 may include a number of different types of I/O circuits.

Controller 34, as used herein, comprises any combination of hardware, software, and/or firmware that may be disposed or resident inside and/or outside of the gaming machine 10 that may communicate with and/or control the transfer of data between the gaming machine 10 and a bus, another computer, processor, or device and/or a service and/or a network. The controller 34 may comprise one or more controllers or processors. In FIG. 2, the controller 34 in the gaming machine 10 is depicted as comprising a CPU, but the controller 34 may alternatively comprise a CPU in combination with other components, such as the I/O circuits 46, 48 and the system memory 36. The controller 34 may reside partially or entirely inside or outside of the machine 10. The control system for a handheld gaming machine 110 may be similar to the control system for the free standing gaming machine 10 except that the functionality of the respective on-board controllers may vary.

The gaming machines 10, 110 may communicate with external systems 50 (in a wired or wireless manner) such that each machine operates as a "thin client," having relatively less functionality, a "thick client," having relatively more functionality, or through any range of functionality therebetween (e.g., a "rich client"). As a generally "thin client," the gaming machine may operate primarily as a display device to display the results of gaming outcomes processed externally, for example, on a server as part of the external systems 50. In this "thin client" configuration, the server executes game code and determines game outcomes (e.g., with a random number generator), while the controller 34 on board the gaming machine processes display information to be displayed on the display(s) of the machine. In an alternative "rich client" configuration, the server determines game outcomes, while the controller 34 on board the gaming machine executes game code and processes display information to be displayed on the display(s) of the machines. In yet another alternative "thick client" configuration, the controller 34 on board the gaming machine 110 executes game code, determines game outcomes, and processes display information to be displayed on the display(s) of the machine. Numerous alternative configurations are possible such that the aforementioned and other functions may be performed onboard or external to the gaming machine as may be necessary for particular applications. It should be understood that the gaming machines 10,110 may take on a wide variety of forms such as a free standing machine, a portable or handheld device primarily used for gaming, a mobile telecommunications device such as a mobile telephone or personal daily assistant (PDA), a counter top or bar top gaming machine, or other personal electronic device such as a portable television, MP3 player, entertainment device, etc.

Figure 3A:
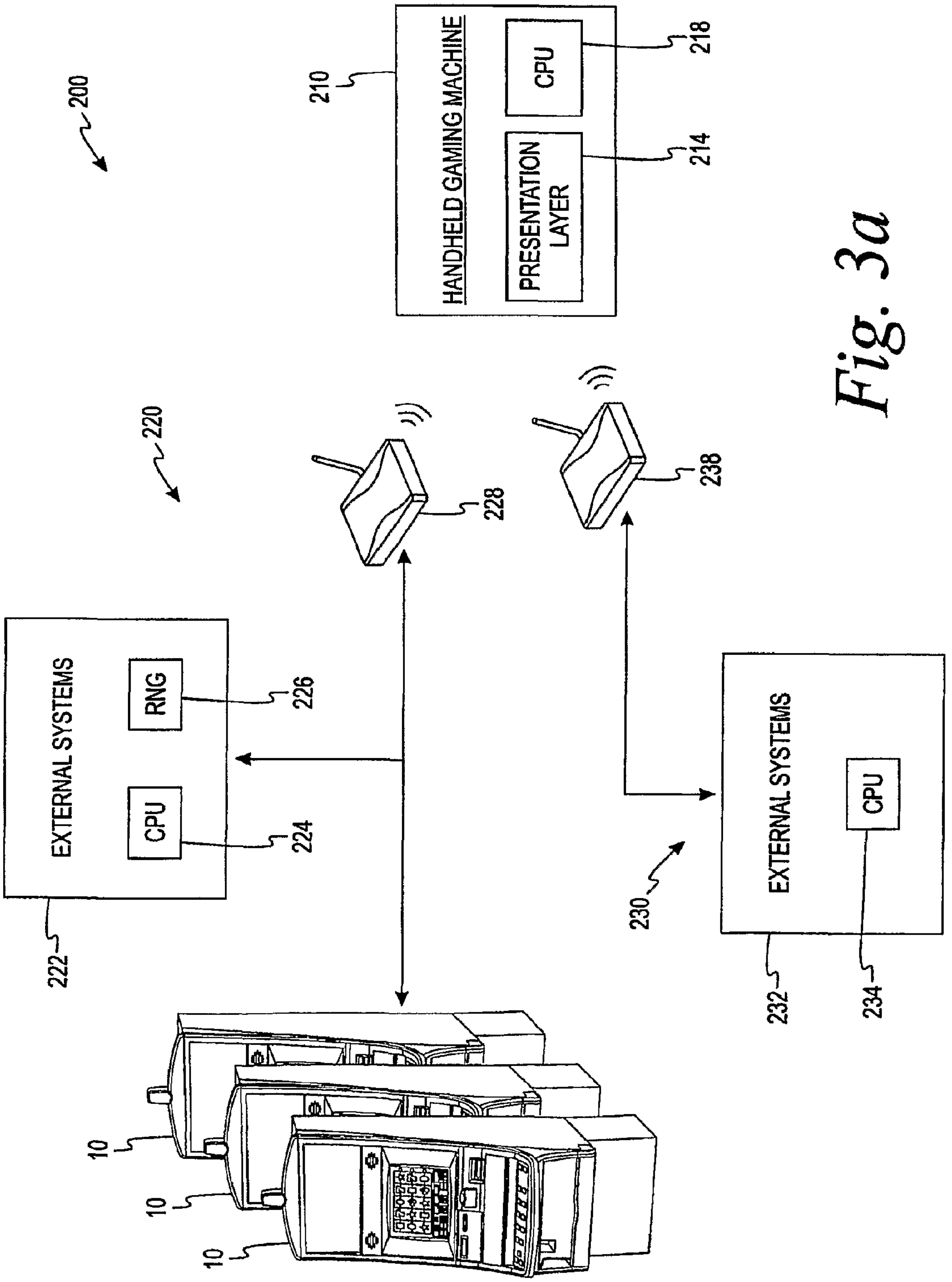
FIG. 3 is a gaming system having a gaming layer and an entertainment layer provided on separate systems, according to one embodiment of the present invention.
FIG. 3*b* is a gaming system having a gaming layer and an entertainment layer provided on the same system, according to another embodiment of the present invention.
FIG. 3*c* is a gaming system having a gaming system provided on a system in communication with a handheld gaming machine having an entertainment layer, according to still another embodiment of the present invention.
Figure 3B:
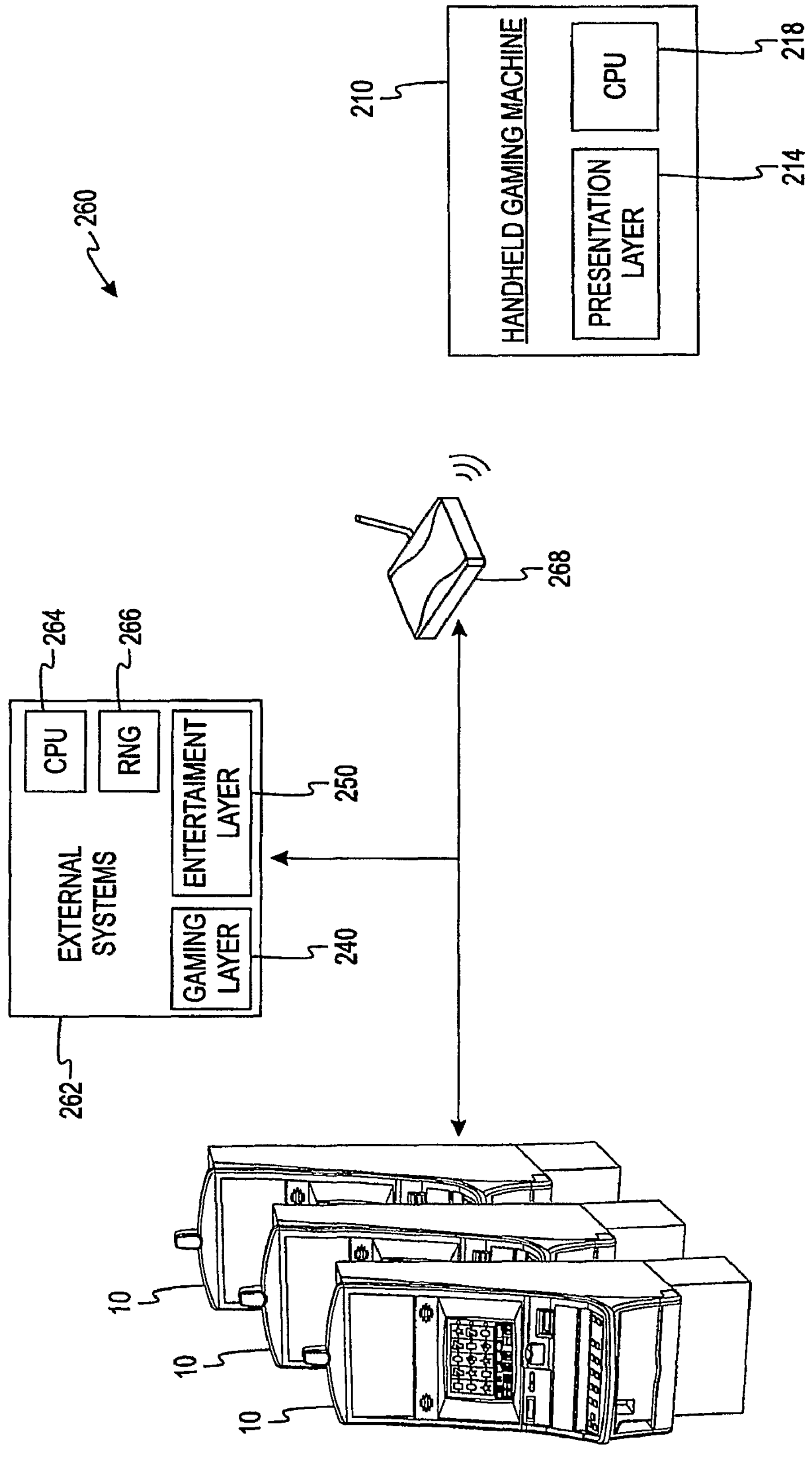
Figure 3C:
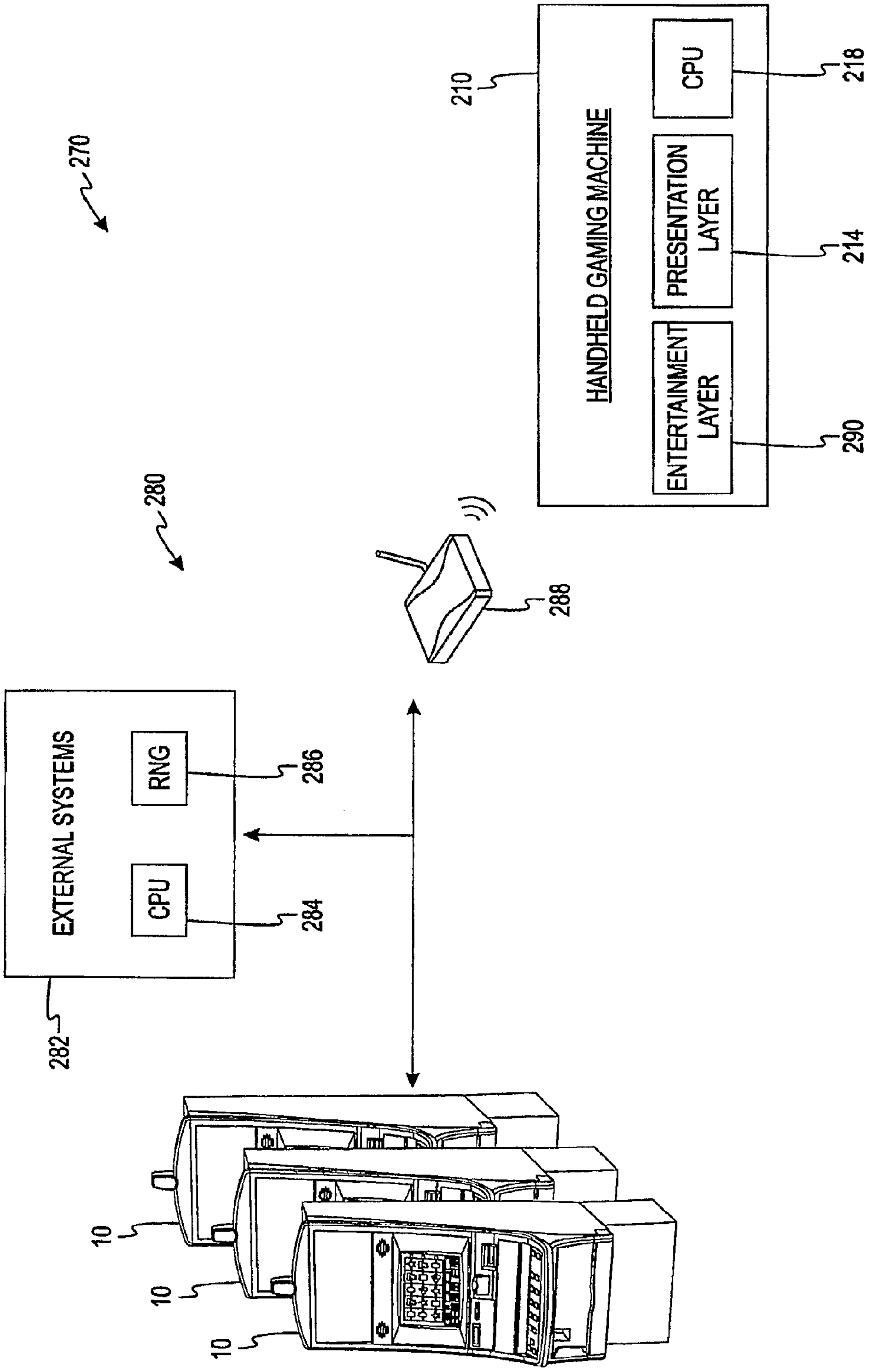

Turning now to FIGS. 3*a*-*c*, various gaming systems are illustrated that may be utilized to provide passive gaming to a user of a gaming machine. Passive gaming provides the user with the ability to participate in and receive awards from an entire wagering game or various aspects thereof without requiring active participation by the user (i.e., direct inputs to the wagering game). Thus, in some embodiments, a user can be utilizing non-gaming functionality while an underlying wagering game can be ongoing without the user's input, but for the user's benefit.

Referring to FIG. 3*a*, a gaming system 200 includes a gaming layer 220 and an entertainment layer 230 in communication with a handheld gaming machine 210. The gaming layer 220 is adapted to provide gaming functionality to the handheld gaming machine 210 while the entertainment layer 230 is adapted to provide non-gaming entertainment functionality. It should be noted that the term "gaming layer," for the purposes of this application, refers to wagering functionality generally while the term "entertainment layer" refers to non-wagering functionality.

The gaming layer 220 includes gaming external systems 222 having a controller 224 and/or a random number generator (RNG) 226. The controller 224 and/or RNG 226 are adapted to provide gaming functionality to the handheld gaming machine 210. The gaming external systems 222 may include additional components such as other gaming machines 10, one or more gaming servers, communications hardware, or a variety of other interfaced systems or components. The gaming layer 220 includes at least one access point 228 adapted to facilitate communication between the gaming external systems 222 (and specifically, at least the controller 224) and the handheld gaming machine 210. The access point 228 may allow for wired or wireless communication between the gaming external systems 222 and the handheld gaming machine 210.

The entertainment layer 230 includes entertainment external systems 232 having a controller 234 adapted to provide entertainment functionality to the handheld gaming machine 210. The entertainment layer 230 includes at least one access point 238 adapted to facilitate communication between the entertainment external systems 232 (and specifically, the controller 234) and the handheld gaming machine 210.

The handheld gaming machine 210 includes a presentation layer 214 capable of displaying or otherwise presenting the information provided by the gaming layer 220 and the entertainment layer 230. The presentation layer 214 presents the information provided by the gaming layer 220 and the entertainment layer 230 audibly and/or visibly to a player using the handheld gaming machine 210. The presentation layer 214 may be used to present all or less than all of the provided information to a player at any given time, as will be discussed further below. The handheld gaming machine 210 further includes a controller (CPU) 218 operable to facilitate the presentation of the provided information by the presentation layer 214.

Referring to FIG. 3*b*, a gaming system 260 is illustrated according to yet another embodiment of the present invention. The gaming system 260 is similar in operation to the gaming system 200 except that the gaming and entertainment layers are controlled by the same external systems in the gaming system 260. The gaming system 260 includes a gaming layer 240 and an entertainment layer 250 both provided by external systems 262. The external systems 262 further include at least one controller 264, adapted to control the gaming layer 240 and the entertainment layer 250. The external systems 262 also include a RNG 266 for use by at least the gaming layer 240 to provide a randomly determined outcome for the gaming functionality. An access point 268 is provided to facilitate the communication of information between the external systems 262 and the handheld gaming machine 210.

Referring to FIG. 3*c*, a gaming system 270 is illustrated according to still another embodiment of the present invention. The gaming system 270 is similar in operation to both gaming system 200 and gaming system 260 except that an entertainment layer 290 is controlled and provided by the handheld gaming machine itself in the gaming system 270, The gaming system 270 includes a gaming layer 280 provided by external systems 282. The external systems 282 further include at least one controller 284, adapted to control the gaming layer 280. The external systems 282 also include a RNG 286 for use by at least the gaming layer 280 to provide a randomly determined outcome for the gaming functionality. An access point 288 is provided to facilitate the communication of information between the external systems 282 and the handheld gaming machine 210. In the embodiment illustrated in FIG. 3*c*, the handheld gaming machine 210 further includes an entertainment layer 290 adapted to provide non-gaming, entertainment functionality to the handheld gaming machine 210.

In the embodiments described above with respect to FIGS. 3*a-c*, the handheld gaming machine 210 may act as a thin client or a rich client with respect to the gaming layers 220, 240, 280, whereas the handheld gaming machine 210 may act as a thin client, rich client, or thick client with respect to the entertainment layers 230, 250, 290. In alternative embodiments, however, the handheld gaming machine 210 may act as either a thin client, rich client, or thick client with respect to each of the various gaming and entertainment layers.

The information provided by the gaming layer 220, 240, 280 and/or the entertainment layer 230, 250, 290 may be encrypted prior to being communicated to the handheld gaming machine 210. In some embodiments, at least the information provided by the gaming layer 220, 240, 280 is encrypted and/or authenticated prior to being wirelessly transmitted to the handheld gaming machine 210. In these embodiments, the encryption and authentication assist in verifying the integrity and source of the transmitted information and of the wagering games provided by the gaming layer 220, 240, 280.

Figure 4:
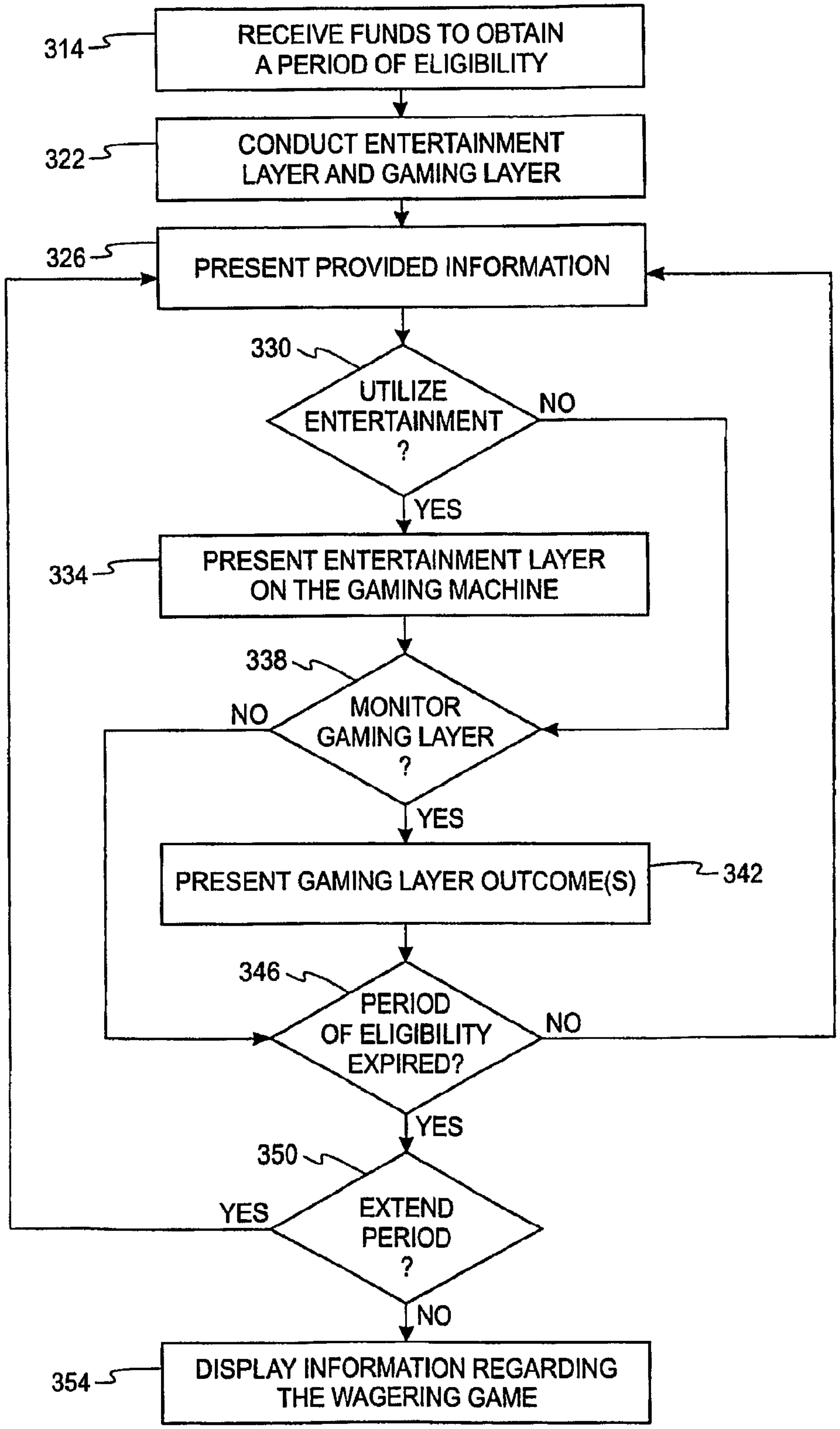
FIG. 4 is a method for providing passive participation in a wagering game, according to one embodiment of the present invention.

Turning now to FIG. 4, a method for providing passive participation in a wagering game is illustrated in accordance with the various gaming systems described above with respect to FIGS. 3*a-c*. The user may be allowed to select the particular wagering game for which he or she wishes to be eligible or the wagering game may be predetermined by the management of the facility at which the passive participation is being offered. The wagering game may be its own, independent wagering game, may mirror an ongoing wagering game or player, may provide eligibility in a community event or bonus game if triggered during the eligibility period, or may be some other aspect of a wagering game or portion thereof.

Where the period of eligibility is for an independent wagering game, the wagering game generally is selected so as to require minimal or no input by a user over the course of the wagering game. Thus, in one embodiment, the wagering game is automatically played by the gaming layer 220, 240, 280 on behalf of the user. The winning outcomes may then be awarded to the user at the close of the period of eligibility.

An example of a wagering game that would require minimal input is a keno type game where there is a waiting period between the selection of a user's numbers and the drawing of the winning numbers. The user is able to select their keno numbers from a provided display of available numbers. The user is then able to utilize one or more features of the entertainment layer 230, 250, 290 to pass the time between the selection of the available numbers and the determination of the winning outcomes by the gaming layer 220, 240, 280.

Where the wagering game mirrors an ongoing wagering game, the user earns the same award that is earned on the mirrored wagering game over the course of the user's period of eligibility. Likewise, the wagering game may mirror a particular active player or players and the user will earn the same award as the player or players earn over the course of the user's period of eligibility. In one embodiment, the mirrored wagering game is played on one or more gaming machines 10 (FIG. 1) within a casino or other gaming establishment. In some embodiments, the mirrored player is playing various wagering games on one or more gaming machines 10.

In one embodiment, where the period of eligibility is for participation or entrance into a community event or bonus game, the user earns the award achieved within the community event(s) or the bonus game(s) over the course of the user's period of eligibility. In other embodiments, the user is able to participate in the community event(s) or the bonus game(s) when such an event is triggered during the course of the user's period of eligibility. In still other embodiments, the user can defer play of the bonus game(s) triggered during the course of the user's period of eligibility. This deferral can allow the user to play the bonus game(s) at a later time during the period of eligibility or, in some embodiments, after the period of eligibility has expired.

To gain participation in a wagering game, funds are received, at step 314, from a user to obtain a period of eligibility for the wagering game. The length of the period of eligibility may vary with respect to the various entertainment or gaming functionality being utilized by a user on a gaming machine. The funds may be received at a gaming machine, or a gaming machine may be provided to the user after the receipt of the funds. The gaming machine can be any gaming machine sufficient to provide the player the below-described functionality.

In some embodiments where a gaming machine is provided to the user upon the receipt of the funds, the gaming machine is a handheld gaming machine, such as the handheld gaming machine 210. The handheld gaming machine 210 is operable to present both an entertainment layer 230, 250, 290 and a gaming layer 220, 240, 280 to the user.

After the funds have been received at step 314, the entertainment and gaming layers are conducted at step 322 and provide information to the user's gaming machine. The entertainment and gaming layers may be conducted by the various external systems 222, 232, 262, 282 or various portions of the entertainment and/or gaming layers may be conducted by both the user's gaming machine and the various external systems 222, 232, 262, 282.

The conducted entertainment and/or gaming layers may be presented on the user's gaming machine at step 326. The presented information may be all or less than all of the information provided to the user's gaming machine by the entertainment and/or gaming layers. The user's gaming machine is adapted to be utilized by a user to interact with the entertainment layer 230, 250, 290, the gaming layer 220, 240, 280, or both. A determination is made, at decision box 330, whether the user would like to utilize the entertainment layer 230, 250, 290 provided on the user's gaming machine. If the user would like to utilize the entertainment layer 230, 250, 290, the entertainment layer 230, 250, 290 is presented to the user at step 334. Once the entertainment layer 230, 250, 290 is presented at step 334—or if the determination is made, at decision box 330, that the user does not wish to utilize the entertainment layer 230, 250, 290—a determination is made, at decision box 338, whether the user would like to monitor the gaming layer 220, 240, 280.

If the determination is made that the user would like to monitor the gaming layer 220, 240, 280, the gaming-layer outcome(s) is presented to the user at step 342. In one embodiment, when the user's gaming machine is also presenting the entertainment layer 230, 250, 290, a notification regarding the gaming-layer outcome(s) may be continuously displayed on the user's gaming machine so as not to interfere with the presentation, interactivity, or play of the entertainment layer 230, 250, 290. In other embodiments, the presentation of the entertainment layer 230, 250, 290 may be interrupted to report the outcome(s) (or winning outcome(s)) of the wagering game(s) of the gaming layer 220, 240, 280 as they occur. These interruptions may be for a predetermined time or may be minimized by the user using the player input device, touch keys, or pushbuttons.

Figure 5A:
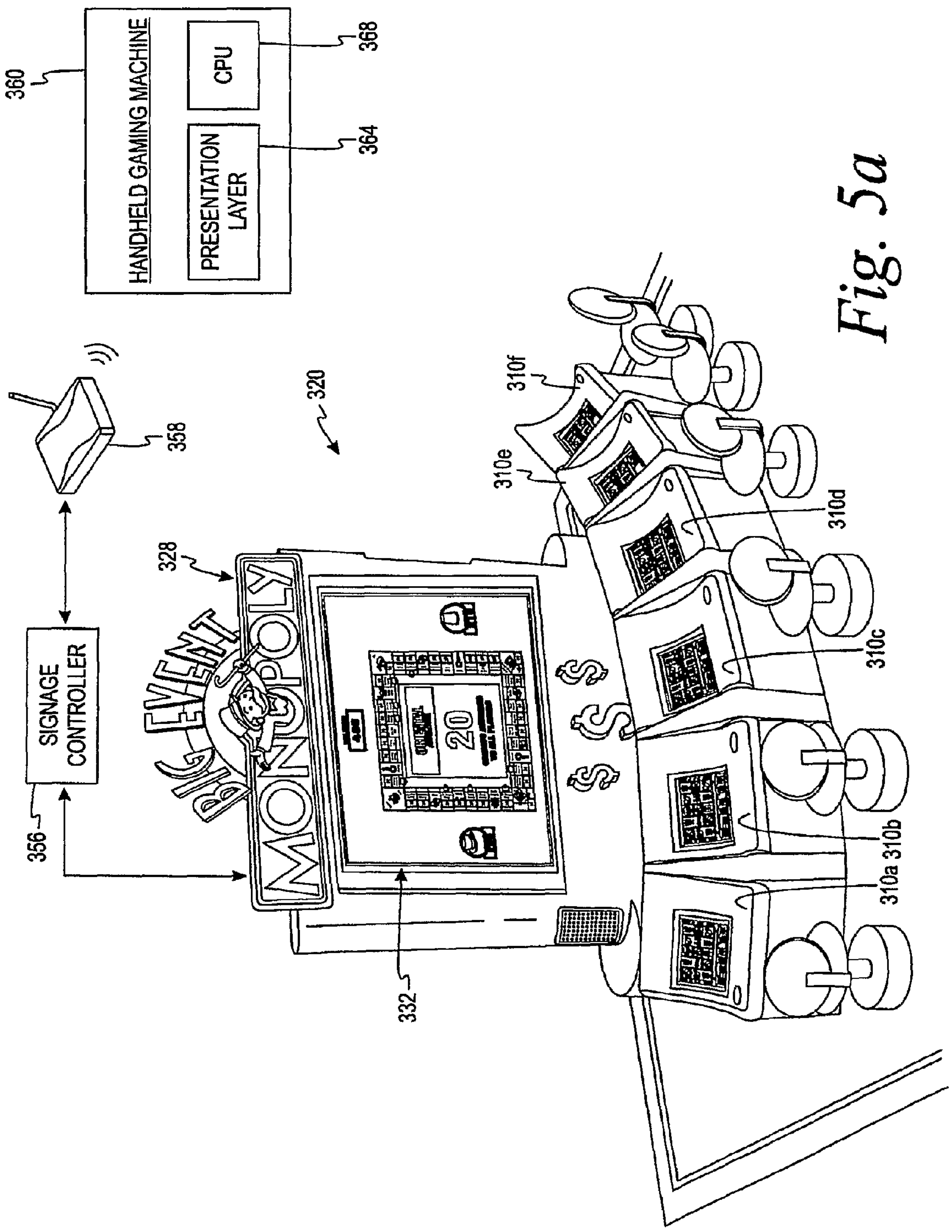
FIGS. 5*a-c* illustrate the operation of a community event on a handheld gaming machine, according to one embodiment of the present invention.
Figure 5B:
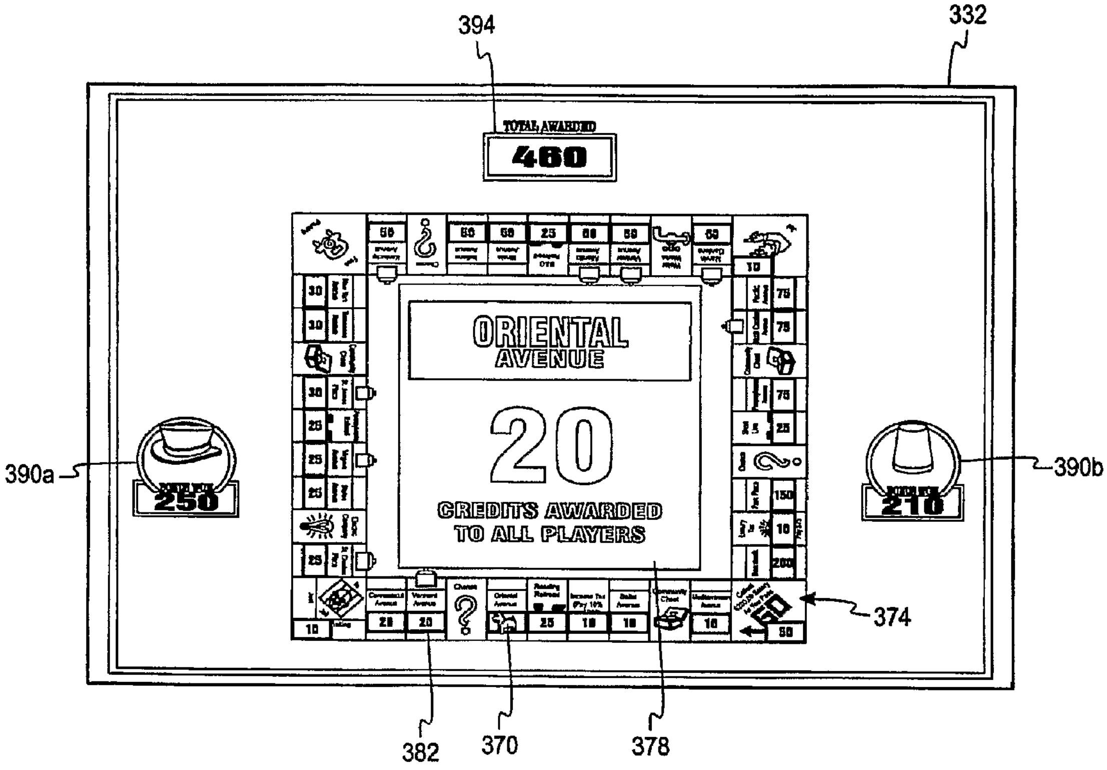
Figure 5C:
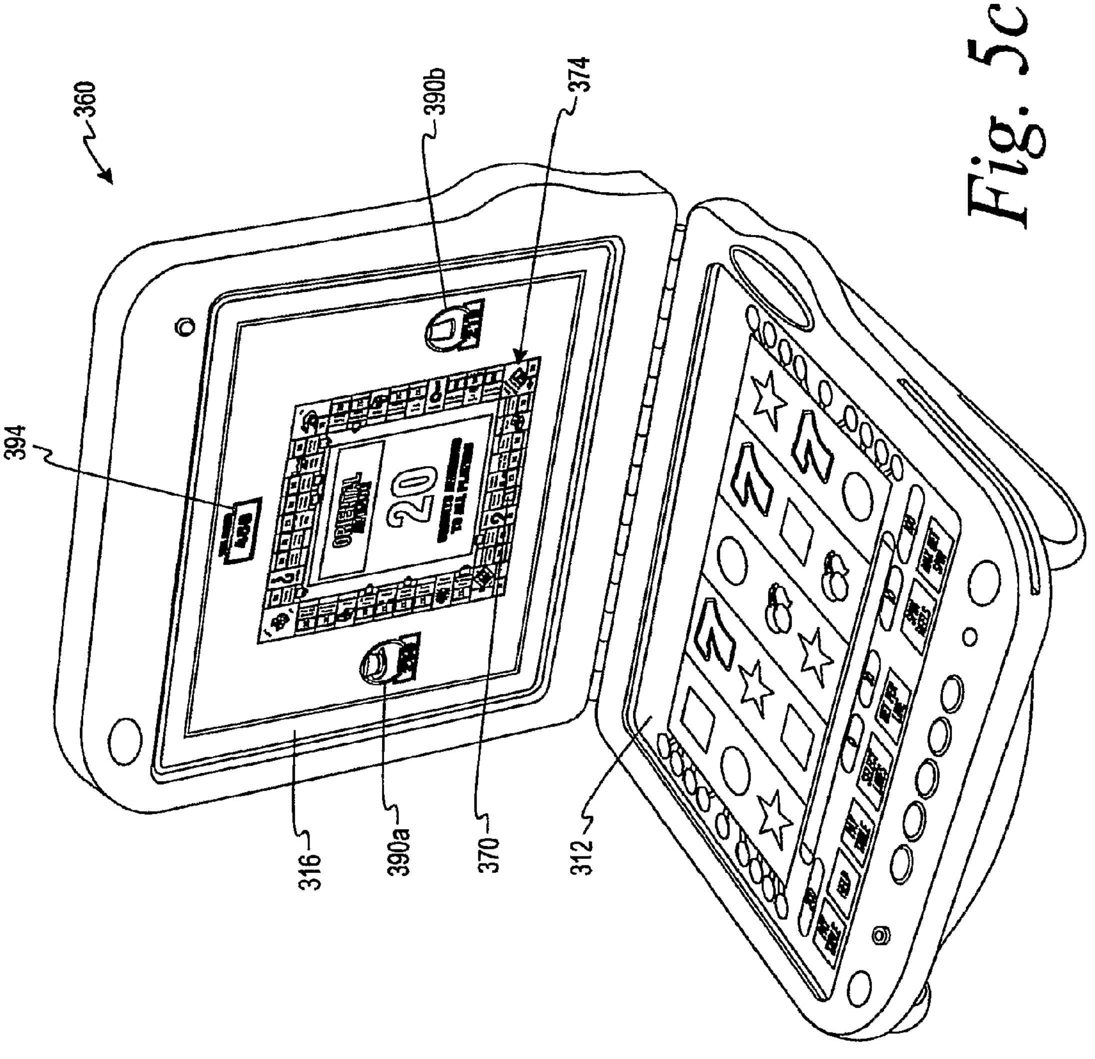

In still another embodiment, the entertainment layer 230, 250, 290 may be interrupted when a community event has been triggered for which the user's period of eligibility extends. The community event can then be displayed on the user's gaming machine simultaneously to (or delayed from) the community event being displayed to a bank of gaming machines as illustrated in FIGS. 5*a-c*.

Referring still to FIG. 4, a determination is made, at decision box 346, whether the period of eligibility for the wagering game has expired. If the period of eligibility has not expired, the above-described process continues. Once a determination is made, at decision box 346, that the period of eligibility has expired, a determination is made, at decision box 350, whether to extend the period of eligibility.

The period of eligibility may be extended by, for example, allowing a user to provide additional funds to extend the period. In other embodiments, the period of eligibility may be extended due to the user's performance and/or choices within the entertainment layer 230, 250, 290 presented on the gaming machine. In still other embodiments, the period of eligibility may be extended by the outcome of the wagering game(s) for which the period of eligibility is applicable.

If a determination is made, at decision box 350, that the period of eligibility is or should be extended, the above-described process continues. Alternatively, once the period of eligibility has expired and is not extended, information regarding the wagering game(s) may be displayed, at step 354, on the user's gaming machine. This information may be, for example, the award values earned by the user during the period of eligibility, the outcome of the wagering game(s) during the period of eligibility, the number of community events or bonus games triggered, etc.

Referring now to FIGS. 5*a-c*, the operation of a community event on a handheld gaming machine 360 (similar to the handheld gaming machine 110) is illustrated, according to one embodiment of the present invention. A gaming system 320 comprises a bank of gaming machines 310*a-f*. The gaming machines 310*a-f* may be of the type described above with respect to FIGS. 1*a*-2 or any other type of gaming machine suitable for operating a wagering game. The gaming machines 310*a-f* are interconnected and included under signage 328. The signage 328 includes a community display 332 for displaying a community event thereon. According to one embodiment, the community display 332 is one or more plasma displays visible to each player seated at the bank of gaming machines 310*a-f*.

The signage 328 may be operated by a signage controller 356 that forms a part of the external systems 50 of FIG. 2. The signage controller 356 is connected to one or more of the gaming machines 310*a-f* and transmits information to, and receives information from, a CPU (e.g., the controller 34 of FIG. 2) in one or more of the gaming machines 310*a-f* throughout the wagering game. The gaming system 320 allows for various aspects of the gaming machines 310*a-f*, such as playing communal games, to be controlled through the signage controller 356 in the signage 328.

In one embodiment, the signage controller 356 controls at least a portion of the gaming layer 220, 240, 280 presented on the handheld gaming machine 360. The signage controller 356 is adapted to communicate with a controller 368 of the handheld gaming machine 360 via an access point 358. The portion of the gaming layer 220, 240, 280 provided by the signage controller 356 is presented on the handheld gaming machine 360 by a presentation layer 364. Thus, the user of the handheld gaming machine 360 may participate in a community event triggered on the gaming system 320 without being in view of the community display 332 and, in some embodiments, without actively participating in a wagering game associated with the community event. In addition, if the community event is triggered during the user's period of eligibility, the handheld gaming machine 360 may notify the player of the occurrence and location of the trigger (in response to a signal from the signage controller 356) and thereby provide the player with an opportunity to walk over to the gaming system 320 and participate in the community event. If the handheld gaming machine 360 is part of a gaming system that can identify the approximate location of the machine 360 relative to the gaming system 320, the handheld gaming machine 360 may even provide the player with visual and/or audio directions to the gaming system 320.

In embodiments in which the entertainment layer 230, 250, 290 is to be interrupted when a community event has been triggered for which the user's period of eligibility extends, the community event is then displayed on the handheld gaming machine 360 simultaneously to (or delayed from) the community event being displayed to the bank of gaming machines 310*a-f* via the community display 332. As illustrated in FIGS. 5*b-c*, the community event may be, for example, a MONOPOLY ONCE AROUND™ game. In the MONOPOLY ONCE AROUND™ game, a game token 370 begins at a first station along a trail 374, such as the GO station on a MONOPOLY® board. The gaming layer, which may be incorporated into the signage controller 356, randomly generates a length of advancement (e.g., a number of spaces) that the token 370 will move along the trail 374. The gaming layer, continues to randomly generate lengths of advancement until the token 370 has completed a single circuit around the trail 374 so as to pass the GO station.

As illustrated in FIGS. 5*b-c*, the token 370 has advanced to "ORIENTAL AVENUE" and an associated payout deed 378 is displayed to the player on the community display 332 and on either or both of a primary display 312 and a secondary display 316 of the handheld gaming machine 360. The payout deed 378 displays a communal value for the particular station to the players, while each player is awarded their respective player values for the station. The player values may be varied by an earned multiplier or other variable earned by the individual players. Once the player values have been displayed, the gaming layer generates another length of advancement and the token 370 moves further along the trail 374.

It should be noted that each player participating in the communal wagering game may be prompted to select an individualized token 370 that is displayed on their gaming machines 310*a-f* or on the handheld gaming machine 360. For example, as illustrated in FIGS. 5*b-c*, the community token 370 used on the community display 332 is a "dog" symbol, while the individual token 370 selected by the user is displayed as a "thimble" symbol on the secondary display 316 of the handheld gaming device 360.

The individualized tokens may also be utilized to represent the player on the community display 332. For example, the community display 332 may include a plurality of player-award meters 390*a*, 390*b* used to display the award accrued by the individual players. The player-award meters 390*a*, 390*b* may also be displayed on the video displays of the individual gaming machines 310*a-f* and the handheld gaming machine 360. A communal-award meter 394 for displaying the total award provided during the communal wagering game is also provided on the community display 332. The communal-award meter 394 displays the overall value of the awards that have been earned by the players over the course of the communal wagering game.

Figure 6:
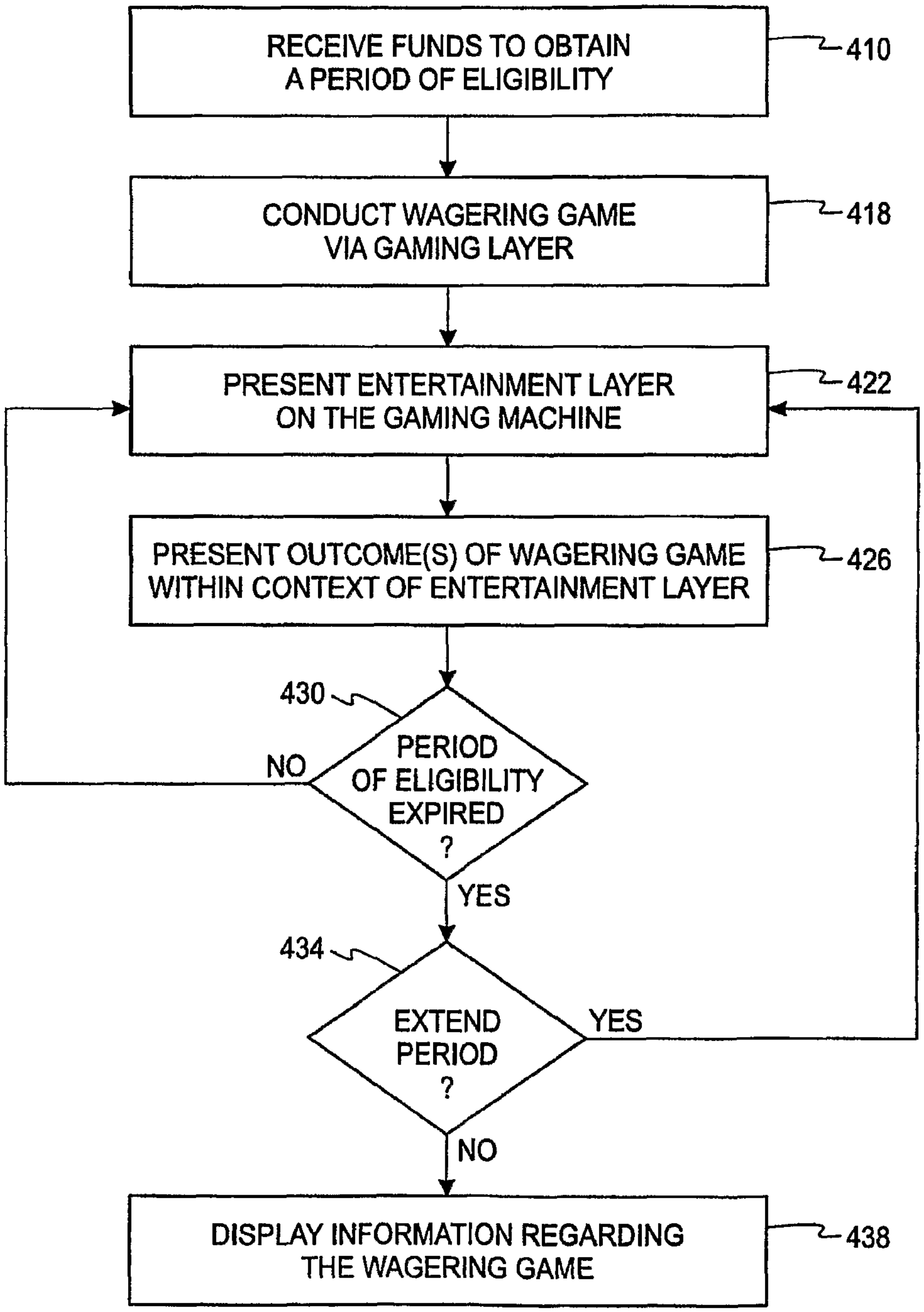
FIG. 6 is a method for providing passive participation in a wagering game, according to one embodiment of the present invention.

FIG. 6 illustrates a method for providing passive participation in a wagering game where the outcome(s) of the gaming layer 220, 240, 280 are presented within the context of the entertainment layer 230, 250, 290. To gain participation in a wagering game, funds are received, at step 410, from a user to obtain a period of eligibility for the wagering game. The user may be allowed to select the particular wagering game that he or she wishes to be eligible or the wagering game may be predetermined by the facility the funds are received at. A gaming machine, such as the handheld gaming machine 110, may be provided to the user once the funds have been received.

After the funds have been received to obtain a period of eligibility at step 410, a wagering game is conducted via a gaming layer at step 418. The wagering game may be conducted on the user's gaming machine, on any of the other linked gaming machines within a gaming system, or both. In one embodiment, the gaming layer 220, 240, 280 is conducted via a controller in wireless communication with the gaming machine provided to the user.

The entertainment layer 230, 250, 290 is presented to a user at step 422 on the user's gaming machine, such as, for example, a handheld gaming machine 210. The user's gaming machine is adapted to be utilized by a user to interact with at least the entertainment layer 230, 250, 290. In the embodiment illustrated in FIG. 6, one or more outcomes of the wagering game are presented to the user at step 426 within the context of the entertainment layer 230, 250, 290. The various outcomes of the wagering game may be displayed as a part of the entertainment layer's 230, 250, 290 entertainment without having to interrupt the entertainment and, in some embodiments, with the actual wagering game results being completely transparent to the user of the gaming machine who is conducting some type of activity relating to the entertainment layer 230, 250, 290.

For example, one feature of the entertainment layer 230, 250, 290 might be an arcade or other amusement game such as Space Invaders®. The user may interact with the space invaders arcade game provided by the entertainment layer 230, 250, 290 while the gaming layer 220, 240, 280 conducts a wagering game. The results of the wagering game can be displayed within the Space Invaders arcade game. For example, the award or awards earned in the wagering game may be presented to a user every time the user destroys an alien within the Space Invaders game. In some embodiments, the award earned in the wagering game may be presented to the user when the user completes a level within the arcade game. It should be understood by those skilled in the art that any action within the entertainment layer 230, 250, 290 could potentially be utilized to reveal an award earned in the wagering game(s) for which the user is eligible.

Similarly, the user's inputs to the entertainment layer 230, 250, 290 could be utilized as inputs for an underlying wagering game provided by the gaming layer 220, 240, 280. In these embodiments, the user's inputs could be utilized to play the underlying wagering game instead of the gaming layer 220, 240, 280 automatically playing the wagering game or in lieu of any other method of operating or playing the underlying wagering game. For example, every time the user fires a missile, destroys an alien, etc., that input or achievement could cause a spin of the reels of an underlying slots game. In these embodiments, the user may or may not be informed that his or her input(s) within the entertainment layer 230, 250, 290 is/are being utilized as a part of the underlying wagering game.

A determination is made, at decision box 430, whether the period of eligibility for the wagering game has expired. If the period of eligibility has not expired, the above-described process continues. Once a determination is made, at decision box 430, that the period of eligibility has expired, a determination is made, at decision box 434, whether to extend the period of eligibility.

The period of eligibility may be extended by, for example, allowing a user to provide additional funds to extend the period. In other embodiments, the period of eligibility may be extended due to the user's performance and/or choices within the entertainment layer 230, 250, 290 presented on the gaming machine. In still other embodiments, the period of eligibility may be extended by the outcome of the wagering game(s) for which the period of eligibility is applicable. For example, the wagering game may have a period-of-eligibility-extension outcome that is randomly selected by an RNG and the gaming layer 220, 240, 280.

If a determination is made, at decision box 434, that the period of eligibility is or should be extended, the above-described process continues. Alternatively, once the period of eligibility has expired and is not extended, information regarding the wagering game(s) may be displayed, at step 438, on the user's gaming machine. This information may be, for example, the award values earned by the user during the period of eligibility, the outcome of the wagering game(s) during the period of eligibility, the number of community events or bonus games triggered, etc.

Figure 7A:
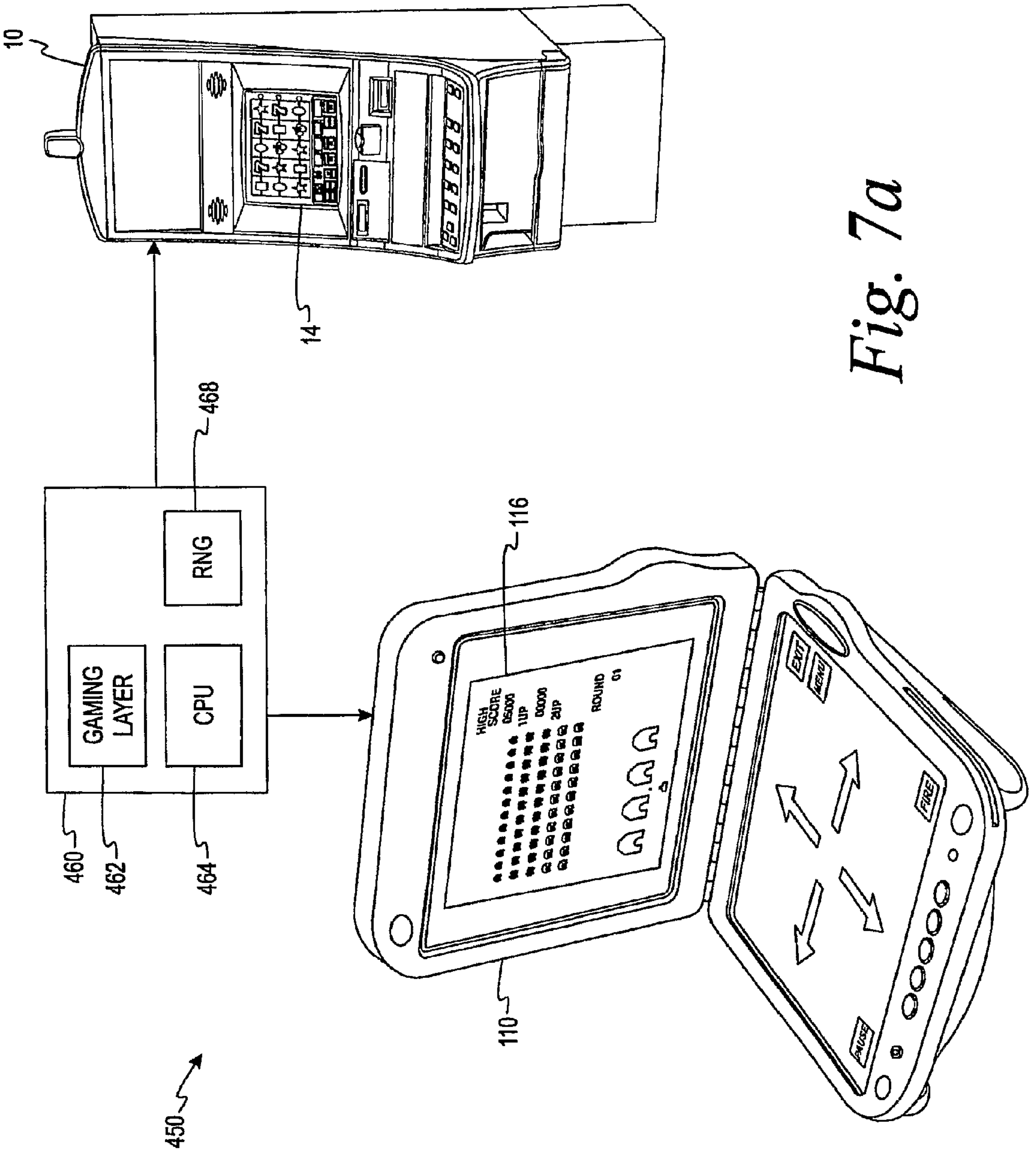
FIGS. 7*a-c* illustrate the presentation of the wagering game outcome(s) within an entertainment layer, according to one embodiment of the present invention.
Figure 7B:
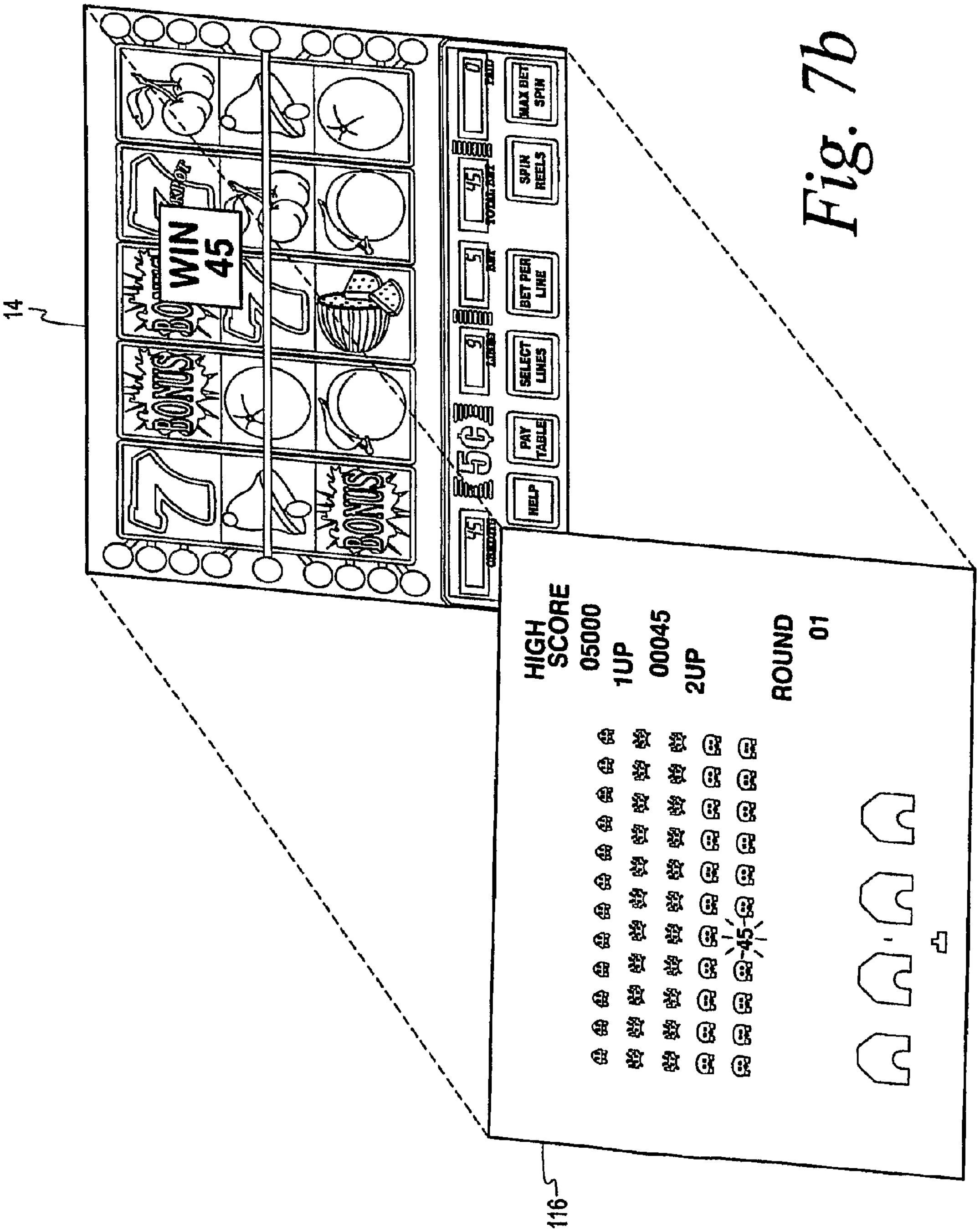
Figure 7C:
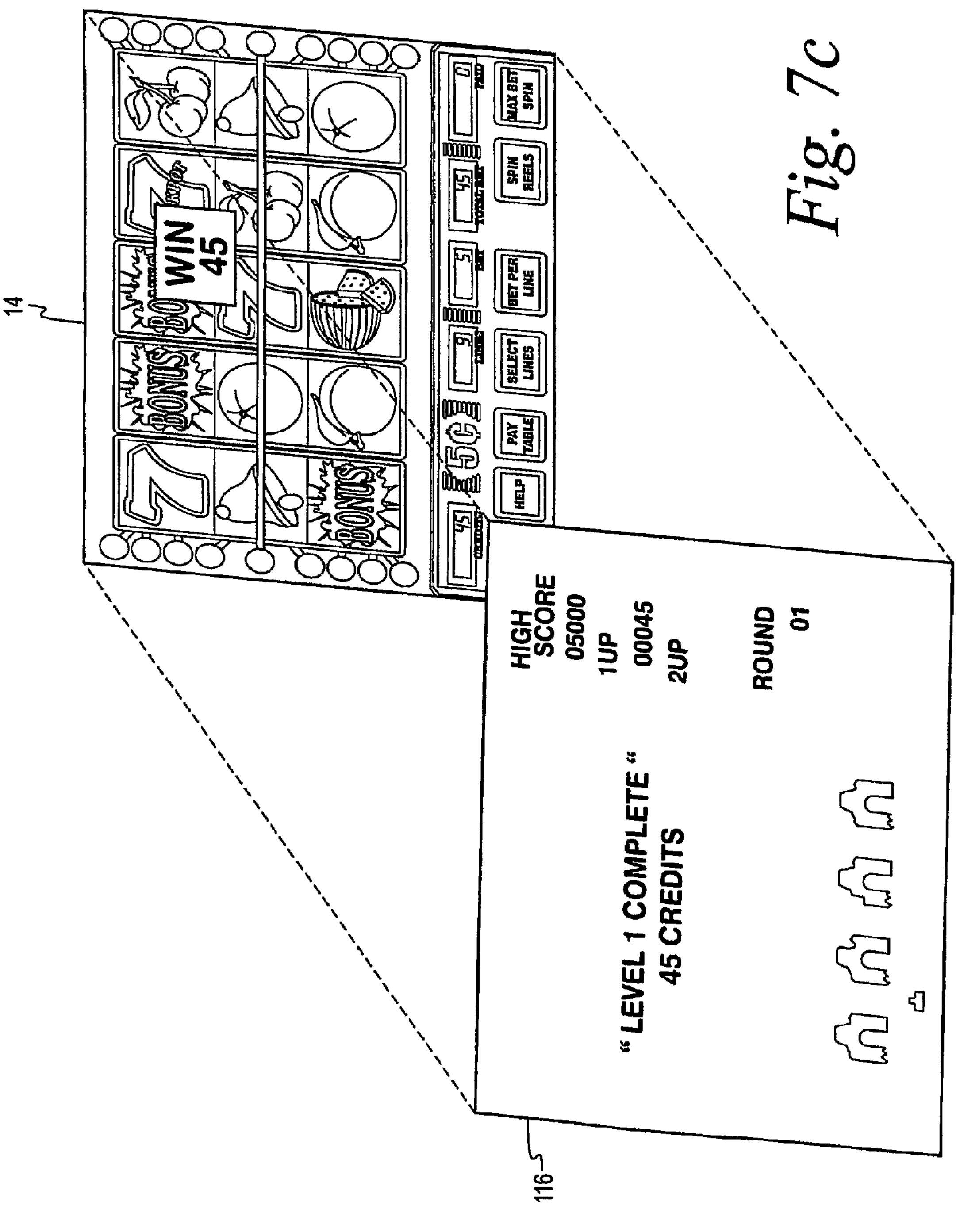

Referring also to FIGS. 7*a-c*, the presentation of the wagering game outcome(s) within the entertainment layer 230, 250, 290 is illustrated, according to one embodiment of the present invention. In FIG. 7*a*, a gaming system 450 is illustrated comprising external systems 460 in communication with at least one gaming machine 10 and at least one handheld gaming machine 110. The external systems 460 include a gaming layer 462 operable by a controller 464 and an RNG 468. The functionality of the gaming layer 462 is provided to the gaming machine 10 and is displayed on one of the gaming machine 10 displays, such as primary display 14. As illustrated in FIG. 7*a*, a wagering game—such as a slots game—provided by the gaming layer 462 is operable on the gaming machine 10.

The handheld gaming machine 110 (see FIG. 1*b*), as illustrated, presents a feature of the entertainment layer 230, 250, 290 to the user via the secondary display 116. In some embodiments, the user interacts with the presented feature of the entertainment layer 230, 250, 290 without knowledge of the wagering game being conducted by the gaming layer 220, 240, 280 in the background. In some embodiments, the user is made aware of the outcome of the wagering game only when the user has earned an award from the underlying wagering game.

As illustrated in FIG. 7*b*, a wagering game, for example, a slots game, is being conducted by the gaming layer 220, 240, 280 and is displayed on the primary game screen 14 of the gaming machine 10. Additionally, an arcade game, such as Space Invaders, is being conducted by the entertainment layer 230, 250, 290 on the secondary display 116 of the handheld gaming machine 110. As shown, a player has earned an award of 45 credits through play of the wagering game on the gaming machine 10. In embodiments in which the user is eligible to receive an award based on the underlying wagering game, this award can be presented to the user in the context of the entertainment layer 230, 250, 290.

For example, as illustrated in FIG. 7*b*, the award earned by the user is displayed as the user destroys one of the aliens within the arcade game. In some embodiments, the award appears all at once as though the destruction of the particular alien resulted in an award being earned. In other embodiments, the award may be divided such that the destruction of several aliens awards the user the earned 45 credits. Alternatively or additionally, as illustrated in FIG. 7*c*, the earned 45 credits may be displayed and awarded as the result of a user's completion of a particular level or goal of the entertainment feature.

It should be noted that the wagering game displayed on the gaming machine 10 in FIGS. 7*a-c* need not be displayed anywhere at all, but rather could be conducted solely at the external system 460 (see FIG. 7*a*) without displaying the wagering game at a remote device such as the gaming machine 10.

In some embodiments, where the feature of the entertainment layer 230, 250, 290 is a game of skill, the awards achieved on the underlying wagering game may be awarded or revealed differently depending on the skill of the player playing the game of skill. For example, a highly skilled player may be awarded his or her award in large chunks as they achieve accomplishments whereas a lower skilled player may receive more random awards or additional awards at the end of a session or between rounds. Thus, the highly skilled player is excited by the large increments he or she receives during play of the game, while both a highly skilled and lowly skilled player will receive the same overall award (assuming the award earned on the underlying wagering game is the same for both players).

Figure 8:
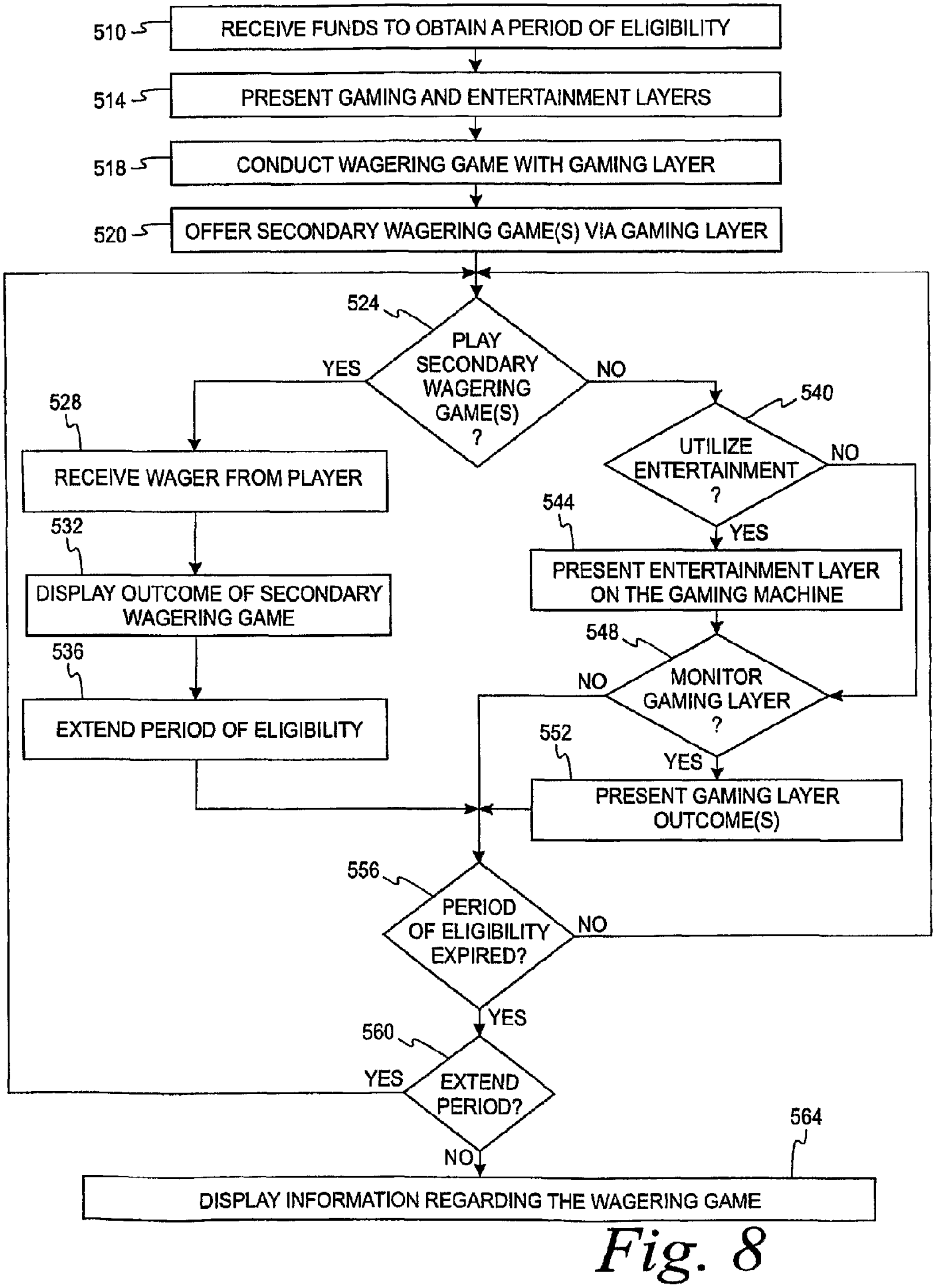
FIG. 8 is a method for providing passive or active participation in a wagering game, according to one embodiment of the present invention.

FIG. 8 illustrates a method for providing passive or active participation in a wagering game. To gain participation in a wagering game, funds are received, at step 510, from a user to obtain a period of eligibility for the wagering game. The user may be allowed to select the particular wagering game for which he or she wishes to be eligible or the wagering game may be predetermined by the facility at which the funds are received.

After the funds have been received, at step 510, to obtain a period of eligibility, the gaming layer 220, 240, 280 is conducted at step 518 and provides information to a user's gaming machine. The user's gaming machine may also be utilized to actively play a second wagering game. The second wagering game generally requires active participation by the user on the user's gaming machine. The second wagering game is offered to the user at step 520 and may be provided by the gaming layer 220, 240, 280 or may be provided by a second gaming layer that may be conducted by another gaming layer of the user's gaming machine itself. A determination is made, at decision box 524, whether a user wishes to play a second wagering game. If the user decides to play a second wagering game, a wager is received from the player at step 528. The second wagering game is conducted and the outcome is displayed to the user at step 532. In some embodiments, a user's period of eligibility is extended by participating in a second wagering game and, in these embodiments, the eligibility period is extended at step 536.

Once the second wagering game has concluded, a determination is made, at decision box 556, whether the period of eligibility for the wagering game has expired. If the period of eligibility has not expired, a determination is again made, at decision box 524, whether the user chose to play a second wagering game. Alternatively, if a determination is made, at decision box 556, that the period of eligibility has expired, a determination is made, at decision box 560, whether to extend the period of eligibility.

The period of eligibility may be extended by, for example, allowing a user to provide additional funds to extend the period. In other embodiments, the period of eligibility may be extended due to the user's performance and/or choices within the entertainment layer presented on the gaming machine. In still other embodiments, the period of eligibility may be extended by the outcome of the wagering game(s) for which the period of eligibility is applicable.

If a determination is made, at decision box 560, that the period of eligibility is or should be extended, a determination is again made, at decision box 524, whether the user chose to play a second wagering game. Alternatively, once the period of eligibility has expired and is not extended, information regarding the underlying wagering game(s) may be displayed, at step 564, on the gaming machine. This information may be, for example, the award values earned by the user during the period of eligibility, the outcome of the wagering game(s) during the period of eligibility, the number of community events or bonus games triggered, etc.

If a determination is made that the user does not choose to play a second wagering game, a determination is made, at decision box 540, whether the user would like to utilize the entertainment layer 230, 250, 290 provided on the gaming machine. If the user would like to utilize the entertainment layer 230, 250, 290, the entertainment layer 230, 250, 290 is presented to the user at step 544. Once the entertainment layer 230, 250, 290 is presented at step 544—or if the determination is made, at decision box 540, that the user does not wish to utilize the entertainment layer 230, 250, 290—a determination is made, at decision box 548, whether the user would like to monitor the gaming layer 220, 240, 280.

If the determination is made that the user would like to monitor the gaming layer 220, 240, 280, the gaming-layer outcome(s) is presented to the user at step 552. In one embodiment, when the gaming machine is also presenting the entertainment layer 230, 250, 290, a notification regarding the gaming-layer outcome(s) may be continuously displayed on the gaming machine so as not to interfere with the presentation, interactivity, or play of the entertainment layer 230, 250, 290. In other embodiments, the presentation of the entertainment layer 230, 250, 290 may be interrupted to report the outcome(s) (or winning outcome(s)) of the wagering game(s) of the gaming layer 220, 240, 280 as they occur. These interruptions may be for a predetermined time or may be minimized by the user using the player input device, touch keys, or pushbuttons.

A determination is made, at decision box 556, whether the period of eligibility for the wagering game has expired. If the period of eligibility has not expired, a determination is again made, at decision box 524, whether the user chose to play a second wagering game. Alternatively, if a determination is made, at decision box 556, that the period of eligibility has expired, a determination is made, at decision box 560, whether to extend the period of eligibility.

If a determination is made, at decision box 560, that the period of eligibility is or should be extended, a determination is again made, at decision box 524, whether the user chose to play a second wagering game. Alternatively, once the period of eligibility has expired and is not extended, information regarding the underlying wagering game(s) may be displayed, at step 564, on the gaming machine. This information may be, for example, the award values earned by the user during the period of eligibility, the outcome of the wagering game(s) during the period of eligibility, the number of community events or bonus games triggered, etc.

The above-described embodiments may be provided with various gaming layer 220, 240, 280 and entertainment layer 230, 250, 290 functionality. For example, the gaming layer 220, 240, 280 may include any number of wagering games, bonus games, community games, progressive games, persistent-state games, etc. Wagering games may, for example, include slots, poker, keno, bingo, roulette, card games (e.g., poker, blackjack, etc.), or other games involving random or pseudo-random outcomes. The entertainment layer 230, 250, 290 may be provided with any number of non-gaming options, such as, for example, video games, arcade games, internet browsing, stories, e-books, articles, tutorials, television, videos, non-wager-accepting wagering games, etc. The entertainment layer 230, 250, 290 may also be provided with a free-roaming adventure in which prizes associated with the gaming layer 220, 240, 280 are revealed based on the interactivity with the entertainment layer 230, 250, 290 by a user.

It should be noted that in each of the above embodiments, the various game play options may be presented on a gaming machine, handheld gaming machine, or other gaming devices. The term gaming machine, as used above in each of the various game play embodiments, includes both the gaming machine 10 (FIG. 1*a*) and handheld gaming machines 110, 210, 360, as well as other gaming devices adapted to present and/or conduct the entertainment layer and/or the gaming layer.

According to some embodiments, the received funds can be thought of as a "rental" fee for the handheld gaming machine 210 if no awards are earned over the course of the period of eligibility. As such, for funding a period of eligibility (e.g., making a wager), the user is provided with the ability to utilize the entertainment layer 230, 250, 290 of the handheld gaming machine 210. In some embodiments, all of the received funds are utilized to fund the period of eligibility, while in other embodiments, some of the received funds fund the period of eligibility while the remaining funds are purely a rental fee for the handheld gaming machine 210.

Each of these embodiments and obvious variations thereof is contemplated as falling within the spirit and scope of the claimed invention, which is set forth in the following claims.

What is claimed is:

1. A method of operating a gaming system, the gaming system including a gaming network of one or more controllers, a communication device, and a second gaming machine that is primarily used for playing a wagering game, the method providing a player at a first gaming machine with passive participation in a special feature of the wagering game played via the second gaming machine, the special feature capable of being triggered during play of the wagering game via the second gaming machine, the method comprising:

in response to an input from the player at the first gaming machine via the communication device, receiving funds to obtain a period of eligibility in the special feature;

during the period of eligibility, presenting at least one feature of an entertainment layer via the first gaming machine;

awarding, by at least one of the one or more controllers the special feature to the player if the special feature is triggered during the period of eligibility; and presenting information regarding the special feature to the player via the first gaming machine.

2. The method of claim 1, further comprising, providing a notification on the first gaming machine regarding the triggering of the special feature if the special feature is triggered during the period of eligibility.

3. The method of claim 2, wherein the notification interrupts the presenting of the at least one feature of the entertainment layer.

4. The method of claim 2, wherein the notification is revealed within the entertainment layer as part of the at least one feature of the entertainment layer.

5. The method of claim 1, wherein the special feature is displayed on the first gaming machine delayed from the display of the special feature to the second gaming machine.

6. The method of claim 1, wherein the player is permitted to defer play of the special feature triggered during the period of eligibility until a later time in the period of eligibility or until after the period of eligibility.

7. The method of claim 1, wherein the special feature is a community event displayed to a plurality of other gaming machines, the plurality of other gaming machines including the second gaming machine.

8. A gaming system for conducting a special feature of a wagering game, comprising:

a gaming network including at least one game controller;

a first gaming machine including a first controller, at least one display, at least one player input device to permit input of a command to the first gaming machine, and a communication device to permit communication between the first gaming machine and the gaming network, the first controller being configured to:

in response to an input from a player at the first gaming machine, initiate the receipt of funds to obtain a period of eligibility in the special feature;

present an entertainment layer during the period of eligibility for the special feature;

award the special feature to the player if the special feature is triggered during the period of eligibility, the special feature capable of being triggered during play of the wagering game via a second gaming machine; and present information regarding the special feature to the player.

9. The gaming system of claim 8, wherein the first controller is further operable to provide a notification on the first gaming machine regarding the special feature, the notification comprising a location of the special feature.

10. The gaming system of claim 9, further comprising an access point, wherein the first gaming machine is a handheld gaming machine including a communication device to permit communication between the handheld gaming machine and the gaming network via the at least one access point.

11. The gaming system of claim 8, wherein first controller is operable to display the special feature on the first gaming machine delayed from the display of the special feature on the second gaming machine.

12. The gaming system of claim 10, wherein the first controller is operable to display the special feature on the first gaming machine remote from a community display of a special event.

13. The gaming system of claim 8, wherein the first controller is further configured to provide to the player an award achieved in the special feature over the course of the period of eligibility.

14. The gaming system of claim 8, wherein the first controller is further configured to defer play of the special feature triggered during the period of eligibility until a later time in the period of eligibility or until after the period of eligibility.

15. The gaming system of claim 8, wherein the special feature is a community event displayed to a plurality of other gaming machines, the plurality of other gaming machines including the second gaming machine.

* * * * *